United States Patent
Hiroki et al.

(10) Patent No.: US 7,279,194 B2
(45) Date of Patent: Oct. 9, 2007

(54) THIN FILM FORMATION APPARATUS AND METHOD OF MANUFACTURING SELF-LIGHT-EMITTING DEVICE USING THIN FILM FORMATION APPARATUS

(75) Inventors: Masaaki Hiroki, Kanagawa (JP); Noriko Shibata, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/776,472

(22) Filed: Feb. 2, 2001

(65) Prior Publication Data

US 2001/0023661 A1    Sep. 27, 2001

(30) Foreign Application Priority Data

Feb. 4, 2000    (JP)    ............... 2000-027523

(51) Int. Cl.
*B05D 5/06*    (2006.01)
(52) U.S. Cl. .................. 427/66; 427/256; 427/422; 427/427.1; 427/600; 118/300
(58) Field of Classification Search ............ 427/66, 427/68, 256, 421.1, 422, 427.1
See application file for complete search history.

(56) References Cited

U.S. PATENT DOCUMENTS

| | | | |
|---|---|---|---|
| 3,484,793 A | 12/1969 | Weigl | 347/2 |
| 3,878,517 A * | 4/1975 | Kasubuchi et al. | 347/74 |
| 4,067,020 A | 1/1978 | Arway | |
| 4,281,332 A * | 7/1981 | Horike | 347/6 |
| 4,357,557 A | 11/1982 | Inohara et al. | |
| 4,737,803 A * | 4/1988 | Fujimura et al. | 347/48 |
| 4,788,629 A | 11/1988 | Handy et al. | 362/23 |
| 4,882,518 A | 11/1989 | Cherry | 313/512 |
| 4,951,064 A | 8/1990 | Kun et al. | 346/107 |
| 4,994,540 A | 2/1991 | Boerner et al. | 528/44 |
| 4,999,229 A | 3/1991 | Moritani et al. | 428/36.6 |
| 5,059,148 A | 10/1991 | McKenna et al. | 445/25 |

(Continued)

FOREIGN PATENT DOCUMENTS

DE    19918193    11/1999

(Continued)

OTHER PUBLICATIONS

Shenk, H. et al, "Polymers for Light Emitting Diodes," EuroDisplay '99, Proceedings of the 19th International Display Research Conference, Berlin, Germany, Sep. 6-9, 1999, pp. 33-37.

(Continued)

*Primary Examiner*—Keith Hendricks
*Assistant Examiner*—Jimmy Lin
(74) *Attorney, Agent, or Firm*—Cook, Alex, McFarron, Manzo, Cummings & Mehler, Ltd.

(57) ABSTRACT

A means of effectively applying an organic EL material application liquid with good application liquid cut-off is provided. A heater and an ultrasonic oscillator are formed in a thin film formation apparatus when applying the application liquid, and heat and ultrasonic oscillations are imparted to the application liquid. Defective application liquid cut-off and liquid clogging can thus be resolved.

34 Claims, 19 Drawing Sheets

U.S. PATENT DOCUMENTS

| | | | |
|---|---|---|---|
| 5,189,405 A | 2/1993 | Yamashita et al. | 340/781 |
| 5,247,190 A | 9/1993 | Friend et al. | 257/40 |
| 5,278,223 A | 1/1994 | Gruenewaelder et al. | 524/502 |
| 5,304,419 A | 4/1994 | Shores | 428/355 |
| 5,334,539 A | 8/1994 | Shinar et al. | 437/1 |
| 5,399,502 A | 3/1995 | Friend et al. | 437/1 |
| 5,608,251 A | 3/1997 | Konuma et al. | 257/337 |
| 5,620,905 A | 4/1997 | Konuma et al. | 438/163 |
| 5,643,826 A | 7/1997 | Ohtani et al. | 437/88 |
| 5,663,573 A | 9/1997 | Epstein et al. | 257/40 |
| 5,684,365 A | 11/1997 | Tang et al. | 315/169.3 |
| 5,714,195 A | 2/1998 | Shiba et al. | |
| 5,747,930 A | 5/1998 | Utsugi | 313/504 |
| 5,757,396 A | 5/1998 | Bruner | 347/27 |
| 5,770,892 A | 6/1998 | Chan et al. | 257/903 |
| 5,817,366 A | 10/1998 | Arai et al. | |
| 5,821,003 A | 10/1998 | Uemura et al. | 428/690 |
| 5,839,456 A | 11/1998 | Han | 134/104.1 |
| 5,844,538 A | 12/1998 | Shiraki et al. | 345/98 |
| 5,869,929 A | 2/1999 | Eida et al. | |
| 5,882,761 A | 3/1999 | Kawami et al. | 428/69 |
| 5,920,080 A | 7/1999 | Jones | 257/40 |
| 5,923,962 A | 7/1999 | Ohtani et al. | 438/150 |
| 5,928,794 A | 7/1999 | Kalinowski et al. | 428/447 |
| 5,962,962 A | 10/1999 | Fujita et al. | 313/412 |
| 5,972,419 A | 10/1999 | Roitman | 427/66 |
| 5,985,356 A * | 11/1999 | Schultz et al. | 427/265 |
| 6,013,982 A | 1/2000 | Thompson et al. | |
| 6,057,647 A * | 5/2000 | Kurosawa et al. | 315/169.3 |
| 6,087,771 A | 7/2000 | Roitman | 313/503 |
| 6,134,020 A | 10/2000 | Masumoto et al. | |
| 6,134,578 A | 10/2000 | Ehlig et al. | 718/100 |
| 6,220,912 B1 | 4/2001 | Shigeoka et al. | 445/24 |
| 6,251,712 B1 | 6/2001 | Tanaka et al. | 438/143 |
| 6,274,887 B1 | 8/2001 | Yamazaki et al. | |
| 6,277,679 B1 | 8/2001 | Ohtani | 438/151 |
| 6,365,917 B1 | 4/2002 | Yamazaki | 257/72 |
| 6,373,453 B1 | 4/2002 | Yudasaka | 345/76 |
| 6,380,007 B1 | 4/2002 | Koyama | 438/151 |
| 6,394,578 B1 | 5/2002 | Akahira et al. | |
| 6,424,326 B2 | 7/2002 | Yamazaki et al. | 345/77 |
| 6,440,877 B1 | 8/2002 | Yamazaki et al. | 438/780 |
| 6,506,635 B1 | 1/2003 | Yamazaki et al. | 438/148 |
| 6,531,713 B1 | 3/2003 | Yamazaki | 257/59 |
| 6,545,359 B1 | 4/2003 | Ohtani et al. | 257/758 |
| 6,548,960 B2 | 4/2003 | Inukai | 315/169.3 |
| 6,583,776 B2 | 6/2003 | Yamazaki et al. | 345/77 |
| 6,585,910 B1 | 7/2003 | Kikuyama et al. | 252/79.3 |
| 6,611,108 B2 | 8/2003 | Kimura | 315/169.3 |
| 6,674,136 B1 | 1/2004 | Ohtani | 257/408 |
| 6,690,033 B2 | 2/2004 | Yamazaki et al. | 257/72 |
| 6,696,105 B2 | 2/2004 | Hiroki et al. | 427/466 |
| 6,699,739 B2 | 3/2004 | Yamazaki et al. | 438/156 |
| 6,702,407 B2 | 3/2004 | Azami | 305/204 |
| 6,714,178 B2 | 3/2004 | Koyama et al. | 345/76 |
| 6,747,638 B2 | 6/2004 | Yamazaki et al. | 345/207 |
| 6,750,835 B2 | 6/2004 | Azami | 345/89 |
| 6,756,740 B2 | 6/2004 | Inukai | 315/169.3 |
| 6,759,678 B2 | 7/2004 | Yamazaki et al. | 257/59 |
| 6,776,844 B2 | 8/2004 | Yonekura et al. | 118/621 |
| 6,781,746 B2 | 8/2004 | Yamazaki et al. | 359/321 |
| 6,784,037 B2 | 8/2004 | Yamazaki et al. | 438/199 |
| 6,797,980 B2 | 9/2004 | Takiguchi et al. | |
| 6,830,494 B1 | 12/2004 | Yamazaki et al. | 445/24 |
| 6,833,668 B1 | 12/2004 | Yamada et al. | 313/505 |
| 2001/0001050 A1 | 5/2001 | Miyashita et al. | 428/690 |
| 2001/0023661 A1 | 9/2001 | Hiroki et al. | 118/300 |
| 2002/0009536 A1* | 1/2002 | Iguchi et al. | 427/10 |
| 2002/0041926 A1* | 4/2002 | Miyashita et al. | 427/66 |
| 2002/0075422 A1 | 6/2002 | Kimura et al. | 349/43 |
| 2002/0197394 A1 | 12/2002 | Yamazaki et al. | 427/66 |
| 2003/0003231 A1 | 1/2003 | Kiguchi et al. | 427/282 |
| 2003/0196597 A1 | 10/2003 | Yamazaki et al. | 118/300 |
| 2004/0048001 A1 | 3/2004 | Kiguchi et al. | 427/421 |
| 2005/0012445 A1 | 1/2005 | Yamazaki et al. | 315/500 |
| 2005/0035708 A1 | 2/2005 | Yamazaki et al. | 313/505 |
| 2005/0082970 A1 | 4/2005 | Yamazaki et al. | 313/506 |

FOREIGN PATENT DOCUMENTS

| | | |
|---|---|---|
| EP | 0 347 058 A2 | 12/1989 |
| EP | 0 683 406 | 11/1995 |
| EP | 0 717 446 | 6/1996 |
| EP | 0 756 932 | 2/1997 |
| EP | 0 776 147 | 5/1997 |
| EP | 0 781 075 | 6/1997 |
| EP | 0 859 539 | 8/1998 |
| EP | 0 862 156 | 9/1998 |
| EP | 0 880 303 | 11/1998 |
| EP | 0 883 191 | 12/1998 |
| EP | 0 892 028 | 1/1999 |
| EP | 0 903 778 A1 | 3/1999 |
| EP | 0 930 641 | 7/1999 |
| EP | 0 940 796 | 9/1999 |
| EP | 0 999 595 | 5/2000 |
| EP | 1 093 156 | 4/2001 |
| EP | 1 093 166 | 4/2001 |
| EP | 1 093 167 | 4/2001 |
| EP | 1 122 801 | 8/2001 |
| GB | 2336553 | 10/1999 |
| JP | 62-090260 | 4/1987 |
| JP | 07-130652 | 5/1995 |
| JP | 07-135323 | 5/1995 |
| JP | 08-078159 | 3/1996 |
| JP | 08-085203 | 4/1996 |
| JP | 08-166775 | 6/1996 |
| JP | 08-234683 | 9/1996 |
| JP | 08-330602 | 12/1996 |
| JP | 09-148066 | 6/1997 |
| JP | 09-194831 | 7/1997 |
| JP | 10 012377 | 1/1998 |
| JP | 10-060331 | 3/1998 |
| JP | 10 092576 | 4/1998 |
| JP | 10-092576 | 4/1998 |
| JP | 10 153967 | 6/1998 |
| JP | 10 189252 | 7/1998 |
| JP | 10-189525 | 7/1998 |
| JP | 10-270363 | 10/1998 |
| JP | 11-016679 | 1/1999 |
| JP | 11 025852 | 1/1999 |
| JP | 11 054270 | 2/1999 |
| JP | 11-054272 | 2/1999 |
| JP | 11-268296 | 10/1999 |
| JP | 2000-173766 | 6/2000 |
| JP | 2000-340798 | 12/2000 |
| WO | WO90/13148 | 11/1990 |
| WO | WO98/24271 * | 6/1998 |
| WO | WO98/27570 * | 6/1998 |
| WO | WO99/10861 | 3/1999 |
| WO | WO99 21233 | 4/1999 |
| WO | WO99/39224 | 8/1999 |

OTHER PUBLICATIONS

English abstract re Japanese Patent Application No. 10-092576, published Apr. 10, 1998.

European Search Report for Reference EP 19819-011/we.

U.S. Appl. No. 09/685,698 to Yamazaki et al., including copies of specification, claims, abstract, drawings and PTO filing receipt.

U.S. Appl. No. 09/685,912 to Yamazaki et al., including copies of specification, claims, abstract, drawings and PTO filing receipt.

English Abstract of JP 11-054270.

English Abstract of JP 10-092576.

English Abstract of JP 10-153967.
English Abstract of JP 10-012377.
English Abstract of JP 10-189252.
English Abstract of JP 11-025852.
Jeffrey A. Hart et al. "A History of Electroluminescent Displays" pp. 1-18 (Sep. 1999) www.indiana.edu/fpd/papers/ELDS.html.
European search report re application No. EP 01 10 2402.3, dated Apr. 25, 2005.
European Search Report re application No. EP 00122446.8, dated Jun. 26, 2001.
EPO Office Action re application No. EP 00122446.8, dated Nov. 4, 2003.
European Search Report re application No. EP 00113577.1, dated Mar. 1, 2004.
U.S. Appl. No. 09/685,912 (pending) to Yamazaki et al, including specification, abstract, claims, drawings and PTO filing receipt, filed Oct. 10, 2000.
U.S. Appl. No. 11/399,024 (pending) to Yamazaki et al, including specification, abstract, claims, drawings and PTO filing receipt, filed Apr. 5, 2006.
Specification for U.S. Appl. No. 09/685,698, filed Oct. 10, 2000.
Wu, C.C. et al, "Integration of Organic LED's and Amorphous Si TFT's Onto Unbreakable Metal Foil Substrates," International Electron Devices Meeting, San Francisco, CA, Dec. 8-11, 1996, IDEM 1996 Technical Digest, pp. 957-959, (1996).
Shim, H. et al, "Electrical and Optical Polymer Systems," Donald L. Wise, ed., p. 938, (1998).
U.S. Appl. No. 09/685,698 to Yamazaki et al, filed Oct. 10, 2000, including specification, claims, abstract, drawings and PTO filing receipt.
U.S. Appl. No. 10/420,383 to Yamazaki et al, filed Apr. 22, 2003, including specification, claims, abstract, drawings and PTO filing receipt.

* cited by examiner

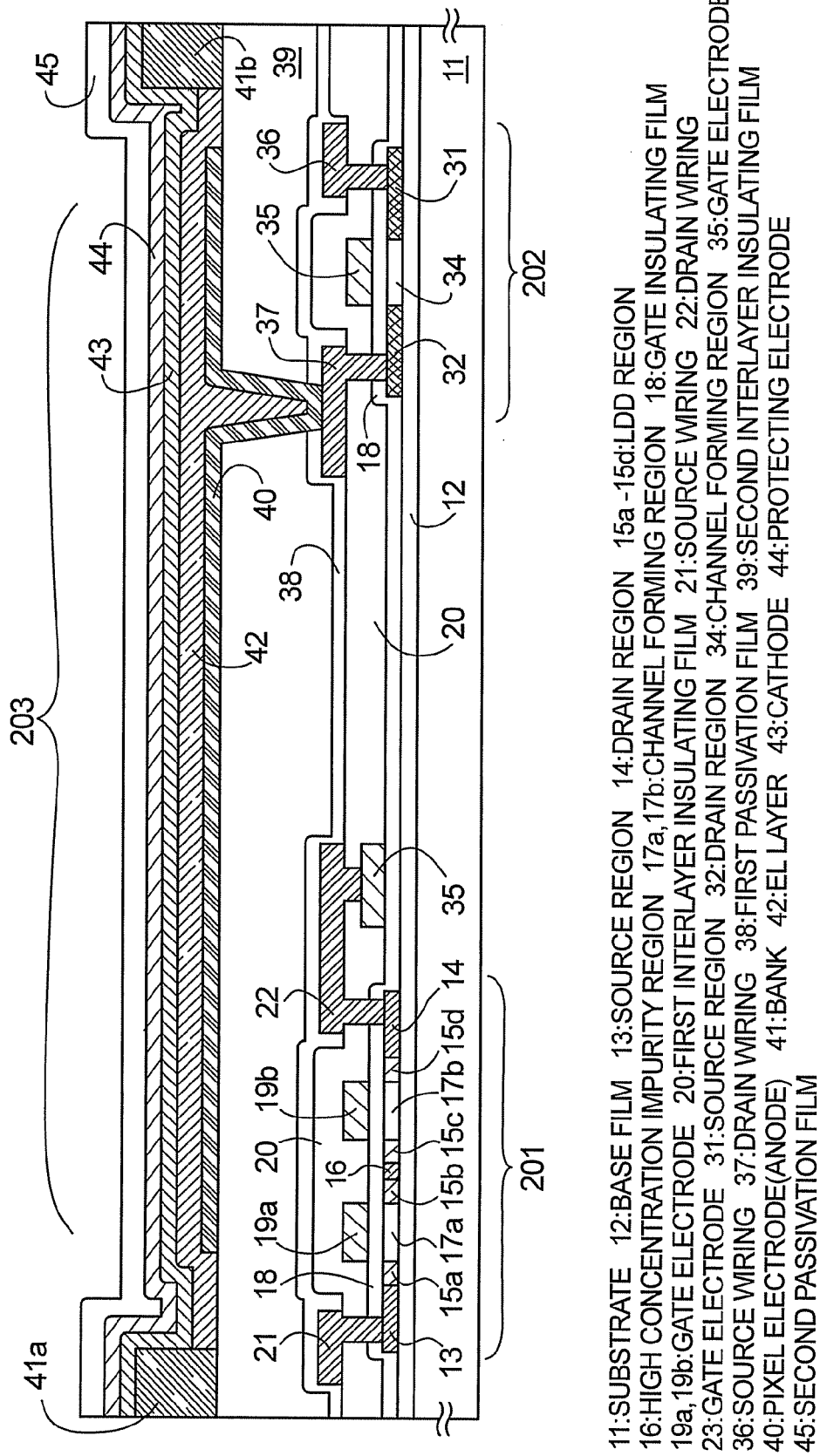

FIG. 2

11:SUBSTRATE  12:BASE FILM  13:SOURCE REGION  14:DRAIN REGION  15a-15d:LDD REGION
16:HIGH CONCENTRATION IMPURITY REGION  17a,17b:CHANNEL FORMING REGION  18:GATE INSULATING FILM
19a,19b:GATE ELECTRODE  20:FIRST INTERLAYER INSULATING FILM  21:SOURCE WIRING  22:DRAIN WIRING
23:GATE ELECTRODE  31:SOURCE REGION  32:DRAIN REGION  34:CHANNEL FORMING REGION  35:GATE ELECTRODE
36:SOURCE WIRING  37:DRAIN WIRING  38:FIRST PASSIVATION FILM  39:SECOND INTERLAYER INSULATING FILM
40:PIXEL ELECTRODE(ANODE)  41:BANK  42:EL LAYER  43:CATHODE  44:PROTECTING ELECTRODE
45:SECOND PASSIVATION FILM

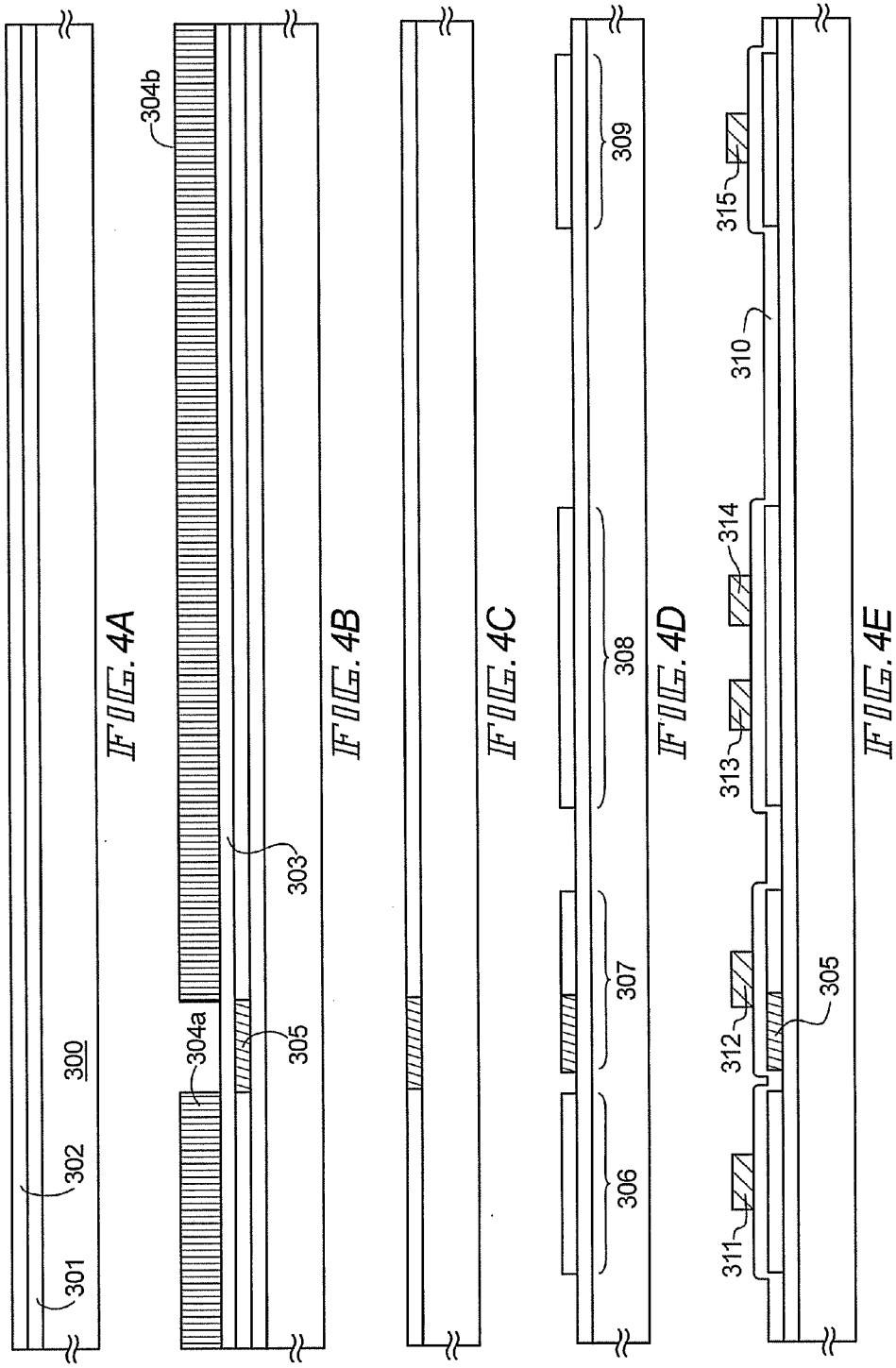

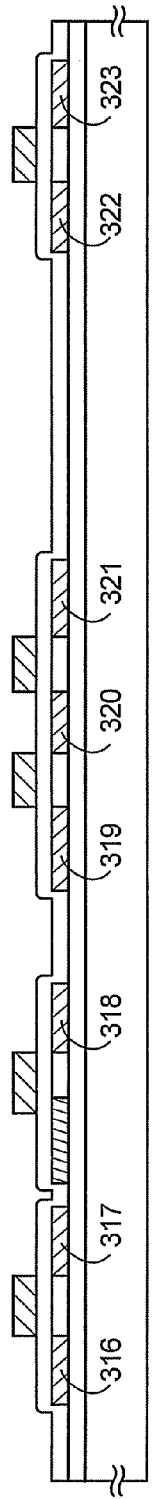
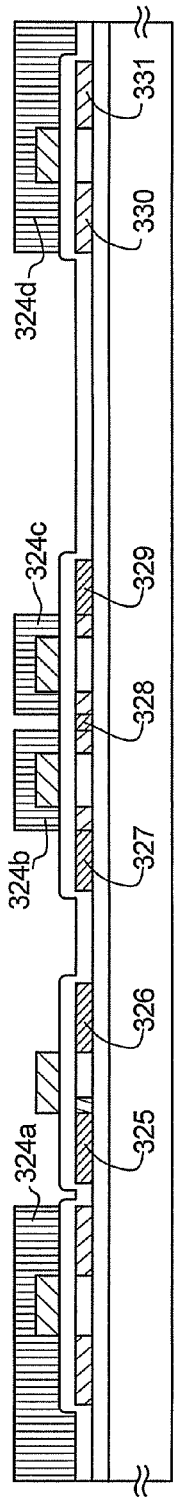
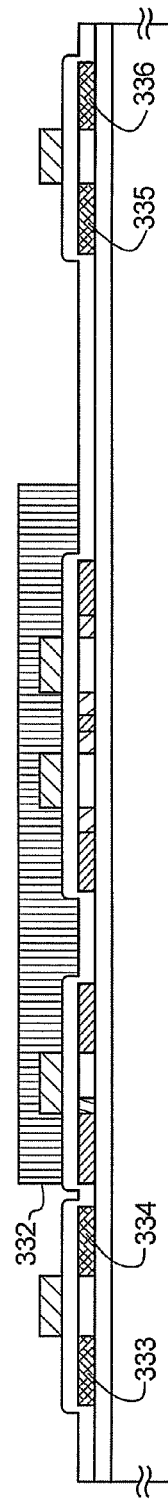
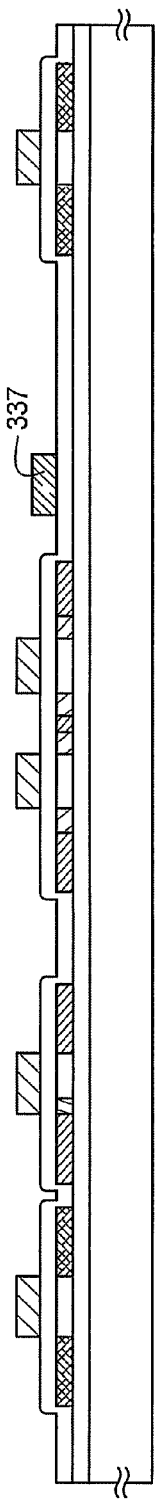
FIG. 5A
FIG. 5B
FIG. 5C
FIG. 5D
316-323: n-TYPE IMPURITY REGION (c)   324a-324d, 332: RESIST MASK   325-329: n-TYPE IMPURITY REGION (a)
333-336: p-TYPE IMPURITY REGION (a)   337: GATE WIRING

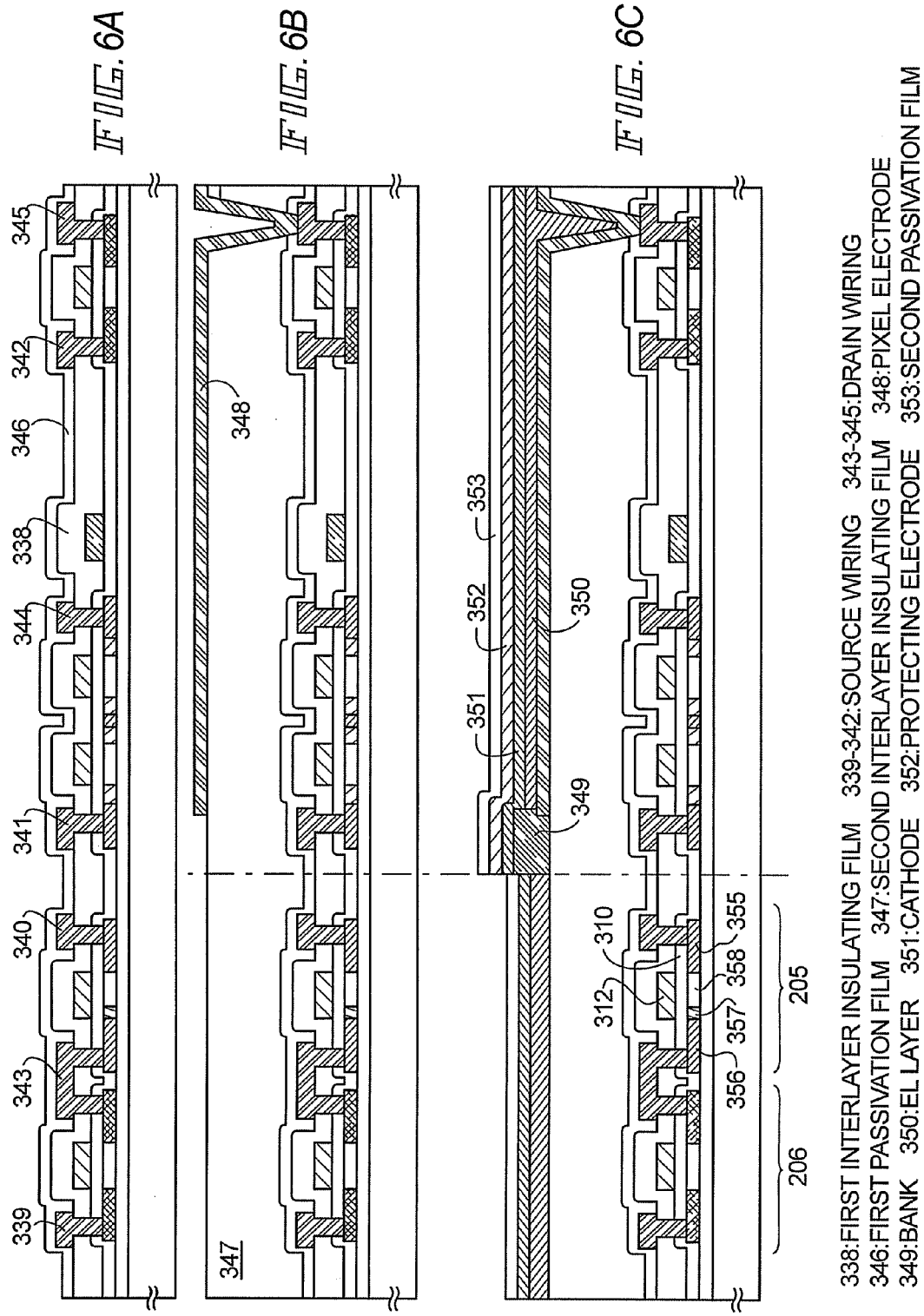

601:SUBSTRATE  602:PIXEL PORTION  603:GATE SIDE DRIVER CIRCUIT
604:SOURCE SIDE DRIVER CIRCUIT  605:SWITCHING TFT  606:GATE WIRING
607:SOURCE WIRING  608:CURRENT CONTROL TFT  609:ELECTRIC POWER SUPPLY
610:EL ELEMENT  611:FPC  612-614:INPUT/OUTPUT TERMINAL  615:CAPACITOR

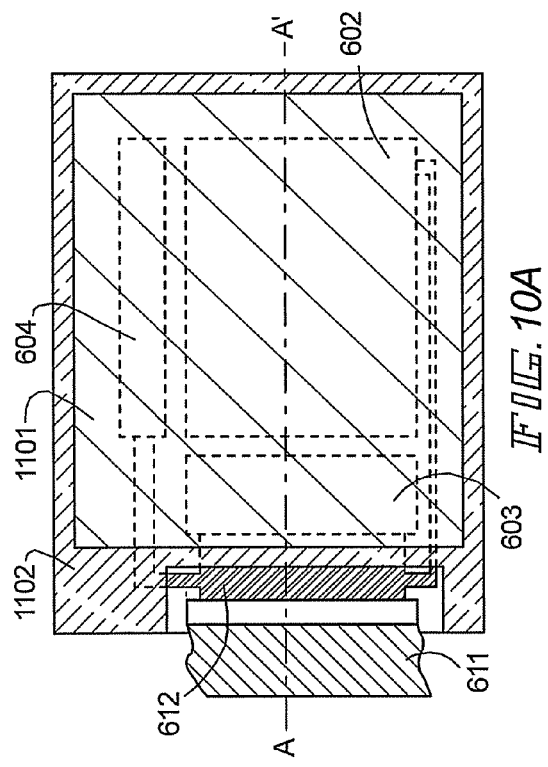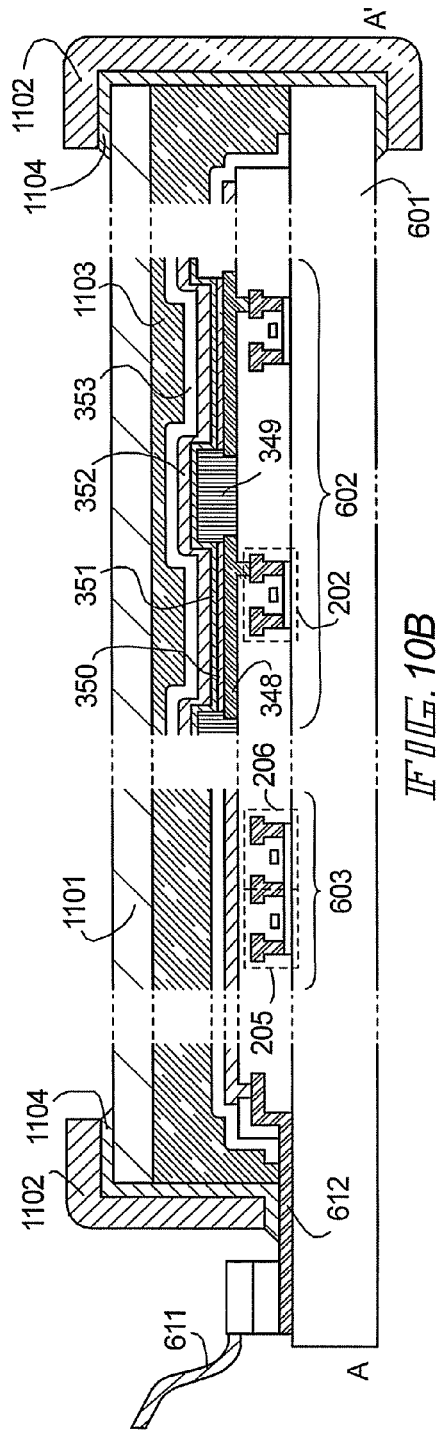
FIG. 10A
FIG. 10B

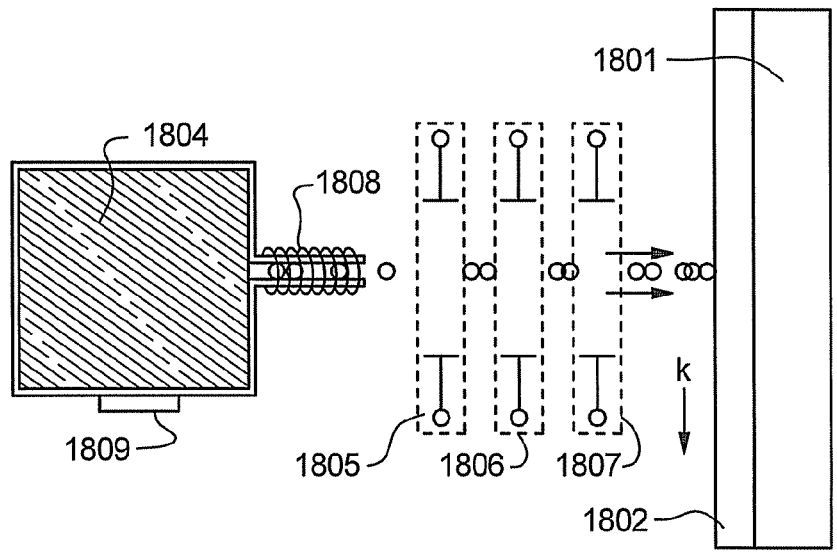
FIG. 15A
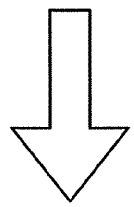
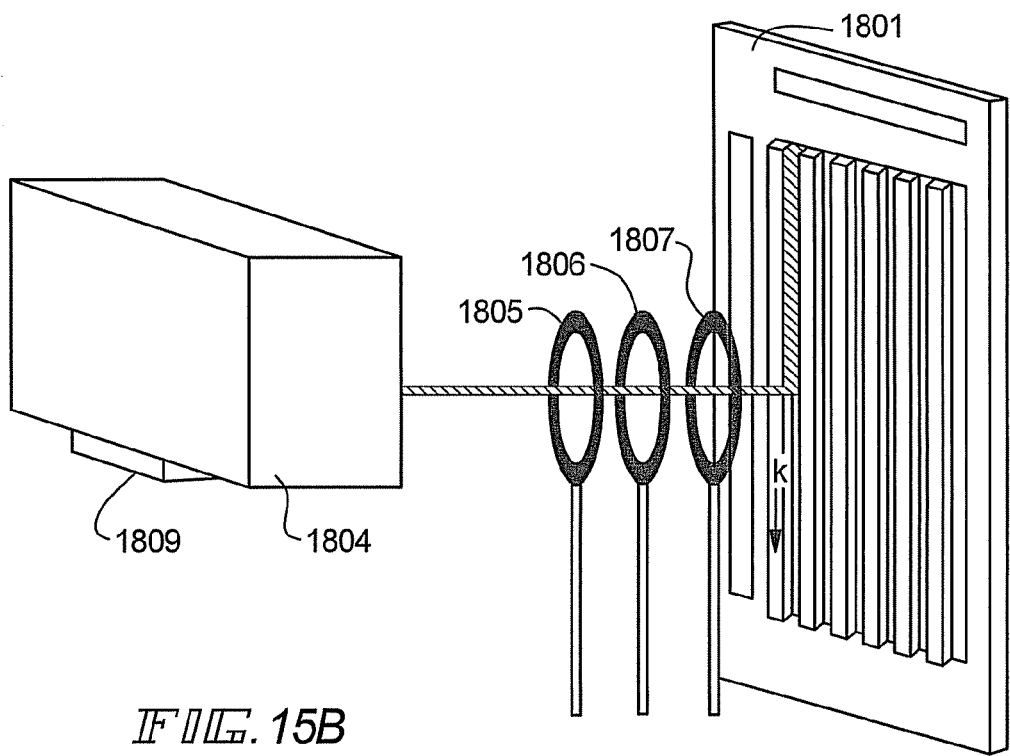
FIG. 15B

THIN FILM FORMATION APPARATUS AND METHOD OF MANUFACTURING SELF-LIGHT-EMITTING DEVICE USING THIN FILM FORMATION APPARATUS

BACKGROUND OF THE INVENTION

1. Field of the Invention

The present invention relates to a self-light-emitting device in which an EL element structured by a light emitting organic material, in which EL (electroluminescence) is obtained, is sandwiched between an anode and a cathode, and to a method of manufacturing electronic equipment having the self-light-emitting device as a display portion (display or display monitor). Note that the above stated self-light-emitting device is also referred to as an OLED (organic light emitting diode).

2. Description of the Related Art

The development of display devices (also referred to as a self-light-emitting device and an EL display device) using an EL element as a self-light-emitting element which utilizes the EL phenomenon of light emitting organic material has been advancing in recent years. The self-light-emitting device emits light by itself, and is looked upon as promising as a display portion of electronic equipment because a back light, such as that of a liquid crystal display device, is unnecessary, and in addition, it has a wide angle of view.

Two types of self-light-emitting devices exist, a passive type (a simple matrix type) and an active type (an active matrix type), and development of both types is brisk. In particular, active matrix type self-light-emitting devices are currently in the spotlight. Further, low molecular weight organic EL materials and high molecular weight (polymer) organic EL materials are being researched as organic EL materials which become an EL layer, which can be said of as the heart of an EL element, but the polymer organic EL materials are being focused upon, more than the low molecular weight EL materials, due to their ease of handling and thermal resistance.

However, when applying a solution in which a polymer organic EL material is dissolved in a solvent, problems such as: liquid cut-off of a discharge portion due to the viscosity of the solution or to surface tension in the discharge portion; and liquid clogging in the discharge portion can develop. Note that, throughout this specification, an EL layer application liquid in which an organic EL material is dissolved in a solvent is referred to as an application liquid. Further, the application liquid include not only applying a solution in which a polymer organic EL material is dissolved in a solvent but also applying a solution in which a polymer organic EL material and monomer organic EL material dissolved together in a solvent.

In addition, there are organic EL materials which emit phosphorescence or fluorescence, where phosphorescence is triplet-based light emission and fluorescence is singlet-based light emission. For the self-light-emitting device of the present invention, it is possible to use either organic EL materials which emits phosphorescence or fluorescence.

Further, it is possible to control the film thickness of the application liquid by applying it with an application method which uses a spinner. However, if a spin application method is used, it becomes sandwiched with processes of wet etching, which is not preferable with respect to an organic EL material.

SUMMARY OF THE INVENTION

The present invention is made in view of the above problems, and an object of the present invention is to provide a means of forming a film efficiently in which a problem of etching after film formation by application in a linear shape of an organic EL material made from a polymer is resolved, and a problem of liquid cut-off and liquid clogging in a discharge portion during discharge is resolved. In addition, an object of the present invention is to provide a self-light-emitting device, and a method of manufacturing the self-light-emitting device, using the means of forming a film. Another object of the present invention is to provide electronic equipment having the self-light-emitting device as a display portion.

In order to achieve the above objects, the viscosity of an application liquid used for application in a linear shape is controlled in accordance with regulation of the dilution of an organic EL material during manufacture, and the film thickness during application is controlled so as to be uniform. In addition, with the present invention, the application of an application liquid for forming an EL layer solves the problems of liquid cut-off defects and liquid clogging when applying the application liquid using a thin film formation apparatus having a head portion and a nozzle.

Note that the head portion has an ultrasonic oscillator in the present invention, and ultrasonic oscillations are imparted to the head portion by the ultrasonic oscillator. Further, the ultrasonic oscillations imparted to the head portion having the nozzle are also imparted to the nozzle.

An application liquid for forming an EL layer fills the nozzle, and the ultrasonic oscillations imparted to the nozzle by the ultrasonic oscillator are also imparted to the application liquid. Note that, a pressure is applied to the application liquid by the application of the ultrasonic oscillations to the application liquid, and that the application liquid is discharged from the nozzle and applied to desired positions in accordance with the added pressure. The application liquid is also discharged from the nozzle by the capillary effect and by the pressure of the weight of the liquid.

Further, a tip portion of the nozzle has a contact element, and it is also possible to apply the application liquid to a pixel column along the contact element in accordance with the contact element contacting a bank on a substrate on which the EL layer is formed. Note that, throughout this specification, a material other than the material used for the nozzle may be used for forming the contact element, and a portion of the tip of the nozzle may be partially improved so as to contact a bank. Further, depending upon the circumstances, the nozzle may directly contact the bank, fulfilling a role as a contact element. Note that it is preferable to use an insulating material as the contact element material.

Note also that the nozzle is coupled to the head portion, and the internal diameter of the nozzle in the vicinity of the coupling portion differs from the size of the internal diameter of the tip portion of the nozzle through which the application liquid is discharged from the nozzle by pressure. The order of the size of the internal diameters is that the internal diameter of the nozzle in the vicinity of the coupling portion is larger in comparison with the internal diameter of the tip portion of the nozzle. By making the internal diameter of the tip portion of the nozzle, through which the application liquid is discharged, smaller, the position controllability of the application position of the liquid is increased.

Furthermore, the tip portion of the nozzle (the portion of the nozzle having a small internal diameter) has a heater, the tip portion of the nozzle is heated by the heater, and the application liquid is also thus heated. Note that cut-off and clogging of the application liquid in the tip portion of the nozzle can be eliminated by heating the application liquid using the heater.

A thin film formation apparatus of the present invention is shown in FIGS. 1A to 1C, and in addition, a method of manufacturing a self-light-emitting device, using the thin film formation apparatus, is explained here.

FIG. 1A is a diagram schematically showing a state of film formation of an organic EL material made from a π conjugate polymer when implementing the present invention. In FIG. 1A, reference numeral 110 denotes a substrate, and a pixel portion 111, a source side driver circuit 112, and a gate side driver circuit 113 are formed by TFTs on the substrate 110. Regions surrounded by a plurality of source wirings connected to the source side driver circuit 112 and a plurality of gate wirings connected to the gate side driver circuit 113 are pixels, and a TFT and an EL element electrically connected to the TFT are formed within the pixels. These pixels are arranged in a matrix in the pixel portion 111.

Note that a method of forming red color, green color, and blue color EL layers at the same time in a stripe shape is shown in this embodiment. The term stripe shape includes a long, thin rectangular shape in which the aspect ratio is greater than or equal to 2, and a long, thin elliptical shape in which the aspect ratio is greater than or equal to 2.

Reference numeral 114a denotes a mixture of an organic EL material which emits red color light and a solvent (hereafter referred to as a red color EL layer application liquid), reference numeral 114b denotes a mixture of an organic EL material which emits green color light and a solvent (hereafter referred to as a green color EL layer application liquid), and reference numeral 114c denotes a mixture of an organic EL material which emits blue color light and a solvent (hereafter referred to as a blue color EL layer application liquid). Note that a method of directly dissolving polymerized organic EL materials in a solvent and then applying, and a method in which a monomer is dissolved in a solvent and then thermally polymerized after film formation, exist for the organic EL materials, and either may be used in the present invention. An example of application in which a polymerized organic EL material is dissolved in a solvent is shown here.

For the present invention, the red color EL layer application liquid 114a, the green color EL layer application liquid 114b, and the blue color EL layer application liquid 114c are discharged separately from the thin film formation apparatus, and are applied in the direction of the arrow. In other words, stripe shape EL layers (strictly speaking, EL layer precursors) are formed at the same time in pixel columns which must emit red color light, in pixel columns which must emit green color light, and in pixel columns which must emit blue color light.

Note that the term pixel column indicates a column of pixels partitioned by a bank 121, and that the bank 121 is formed on the source wirings. Namely, a plurality of pixels lined up in series along the source wiring is referred to as a pixel column. However, although a case of forming the bank 121 on the source wirings is explained here, the bank 121 may also be formed on the gate wirings. In that case, a plurality of pixels lined up in series along the gate wiring is referred to as a pixel column.

The pixel portion 111 can therefore be seen as an aggregate of a plurality of pixel columns divided into stripe shapes by the banks formed on the plurality of source wirings or on the plurality of gate wirings. When seen as such, the pixel portion 111 can be said to be composed of pixel columns in which stripe shape EL layers which emit red color light are formed, pixel columns in which stripe shape EL layers which emit green color light are formed, and pixel columns in which stripe shape EL layers which emit blue color light are formed.

Further, the above stripe shape bank is formed on the plurality of source wirings or on the plurality of gate wirings, and therefore the pixel portion 111 can effectively be seen as an aggregate of a plurality of pixel columns divided by the plurality of source wirings or the plurality of gate wirings.

A state of the head portion (also referred to as a discharge portion) of the thin film formation apparatus is shown in FIG. 1B when performing the application process shown in FIG. 1A.

Reference numeral 115 denotes a head portion of a thin film formation apparatus, and a red color nozzle 116a, a green color nozzle 116b, and a blue color nozzle 116c are attached. Further, the red color EL layer application liquid 114a, green color EL layer application liquid 114b, and green color EL layer application liquid 114b and blue color EL layer application liquid 114c are stored in the inside of the respective nozzles.

The application liquids are discharged onto the pixel portion 111 by pressurization. Note that the application liquids are discharged to a plate (not shown in the figures) which partitions the nozzles 116a, 116b, and 116c and a piping 117 by an inert gas stored in the piping 117. An application process such as that shown in FIG. 1A is performed by scanning the head portion 115 along vertical directions of a page.

Note that the red color EL layer application liquid 114a, the green color EL layer application liquid 114b, and the blue color EL layer application liquid 114c are prepared in the red color nozzle 116a, the green color nozzle 116b, and the blue color nozzle 116c, respectively, and that the application liquid is not limited to these colors. Further, one nozzle prepared with the application liquid, or a plurality of such nozzles, may be used.

In addition, an ultrasonic oscillator 122 is attached to the head portion 115 in order to impart oscillations by ultrasonic waves in order to make the application liquid easier to discharge. This is connected to an external ultrasonic electronic power supply.

Note that the position at which the ultrasonic oscillator is attached is not limited to the position shown in FIG. 1B, and that another position may also be used, and that an ultrasonic oscillator may also be attached to each nozzle.

In addition, heaters 123a, 123b, and 123c are formed in the nozzles 114a, 114b, and 114c, respectively. The heaters are formed for regulating the temperature of the application liquids in order to discharge the application liquids well, and if a resistive material is placed in portions which become the heaters, the voltage applied to the heaters can be controlled by the resistive material. The temperature of the heater portion can be regulated by controlling the voltage, and therefore a material which imparts a resistance so as to achieve a suitable temperature in each of the application liquids may be selected for the resistive materials used here. Note that the resistive materials may exist so as to contact the nozzle, and when the nozzle is formed by a semiconductor material, a resistive material may be doped into the nozzle itself. Further, a metallic material such as copper, iron, aluminum, tungsten, tantalum, nickel, phosphorous, boron, arsenic, and antimony is used as the resistive material. Temperature regulation of the discharge liquids thus becomes possible.

In addition, as the heater used here, one in which a temperature measuring portion is formed in the heater portion of each nozzle, a circuit which detects the temperature of each application liquid, feeds back the detected temperature information and converts this to a new electronic signal is formed, and each circuit has a function so as to control the temperature of each heater, may be used.

Further, it is recorded within this specification that the head portion is scanned, but it is also possible to move a substrate in a vertical direction or in a horizontal direction by using an x-y stage.

An enlarged diagram of the vicinity of the discharge portion shown by reference numeral 118 here is shown in FIG. 1C. The pixel portion 111 formed on the substrate 110 is an aggregate of a plurality of pixels composed of a plurality of TFTs 119a to 119c and a plurality of pixel electrodes 120a to 120c. When pressure is applied to the nozzles 116a to 116c, the application liquids 114a to 114c are discharged in accordance with the pressure.

Note that the banks 121 are formed by a resin material between pixels, and that mixing of the application liquids between adjacent pixels is prevented. By narrowing the width of the banks 121 with this structure (determined by photolithography resolution), the accumulation level of the pixel portion increases, and a high definition image can be obtained. Further, it is preferable that the application used here have a viscosity from $1 \times 10^{-3}$ to $3 \times 10^{-2}$ Pa·s here.

Further, acrylic, polyimide, polyamide, and polyimide amide can be used as resin materials capable of forming the banks 121. If the resin material is made black in advance by forming a material such as carbon or a black color pigment material, then it also becomes possible to use the banks 121 as light shielding films between pixels.

Furthermore, it is also possible to regulate so as to always maintain a constant distance between the application surface and the nozzles by attaching a sensor which uses a light reflection in any of the nozzles 116a, 116b, and 116c. Note that, although it is preferable to attach the sensor at the tip of the nozzle, there is no limitation on the sensor attachment position. In addition, by preparing a mechanism for regulating the gap between the nozzles 116a to 116c in response to the pixel pitch (the distance between pixels), it is possible to correspond to self-light-emitting devices having any type of pixel pitch.

The application liquids 114a to 114c discharged from the nozzles 116a to 116c are thus applied so as to cover the pixel electrodes 120a to 120c, respectively. The organic solvents contained in the application liquids 114a to 114c are vaporized by a heat treatment process (baking process or firing process) within a vacuum after the application liquids 114a to 114c are applied, forming the EL layers from the organic EL materials. The organic solvent used therefore is volatized at a temperature lower than the glass transition temperature (Tg) of the organic EL materials used. Further, the film thickness of the EL layers finally formed is determined by the viscosity of the organic EL materials. In this case, it is preferable that the viscosity be from $1 \times 10^{-3}$ to $5 \times 10^{-2}$ Pa·s (more preferably between $1 \times 10^{-3}$ $2 \times 10^{-2}$ Pa·s).

In addition, if there are many impurities within the organic EL materials, they become a cause of EL layer degradation, and the efficiency of light emission is reduced, and therefore it is preferable to reduce the amount of impurities within the organic EL materials as much as possible.

Note that it is very important the solvents and the organic EL materials be thoroughly refined, and that the environment when mixing the solvents and the organic EL materials be cleaned as much as possible in order to reduce impurities. It is preferable to repeatedly perform a technique such as distillation, sublimation, filtration, recrystallization, reprecipitation, chromatography, or dialysis for the refining of the solvents and the refining of the organic EL materials. It is preferable to reduce the impurities such as metal elements and alkaline metal elements to 0.1 ppm or less (more preferably to 0.01 ppm or less).

Furthermore, it is preferable to also pay sufficient attention to the atmosphere when applying the application liquid containing the organic EL material in accordance with a thin film formation apparatus such as that of FIG. 1. In particular, it is preferable to perform the above stated organic EL material film formation process within clean booth or a glove box filled by an inert gas such as nitrogen.

An application liquid can be applied uniformly and with good efficiency, and an EL layer made from a polymer organic EL material can be formed with high throughput in accordance with the above thin film formation apparatus. In addition, the EL material can be applied in a stripe shape, without breaks, in one pixel column, and therefore throughput is extremely high.

BRIEF DESCRIPTION OF THE DRAWINGS

In the accompanying drawings:

FIG. 2 is a diagram showing a cross sectional structure of a pixel portion;

FIGS. 4A to 4E are diagrams showing a process of manufacturing a self-light-emitting device;

FIGS. 5A to 5D are diagrams showing the process of manufacturing the self-light-emitting device;

FIGS. 6A to 6C are diagrams showing the process of manufacturing the self-light-emitting device;

FIGS. 10A and 10B are diagrams showing cross sectional structures of an active matrix type self-light-emitting device;

FIGS. 15A and 15B are diagrams showing an organic EL material application process of the present invention;

DETAILED DESCRIPTION OF THE PREFERRED EMBODIMENTS

Embodiment Mode

Figure 3A:
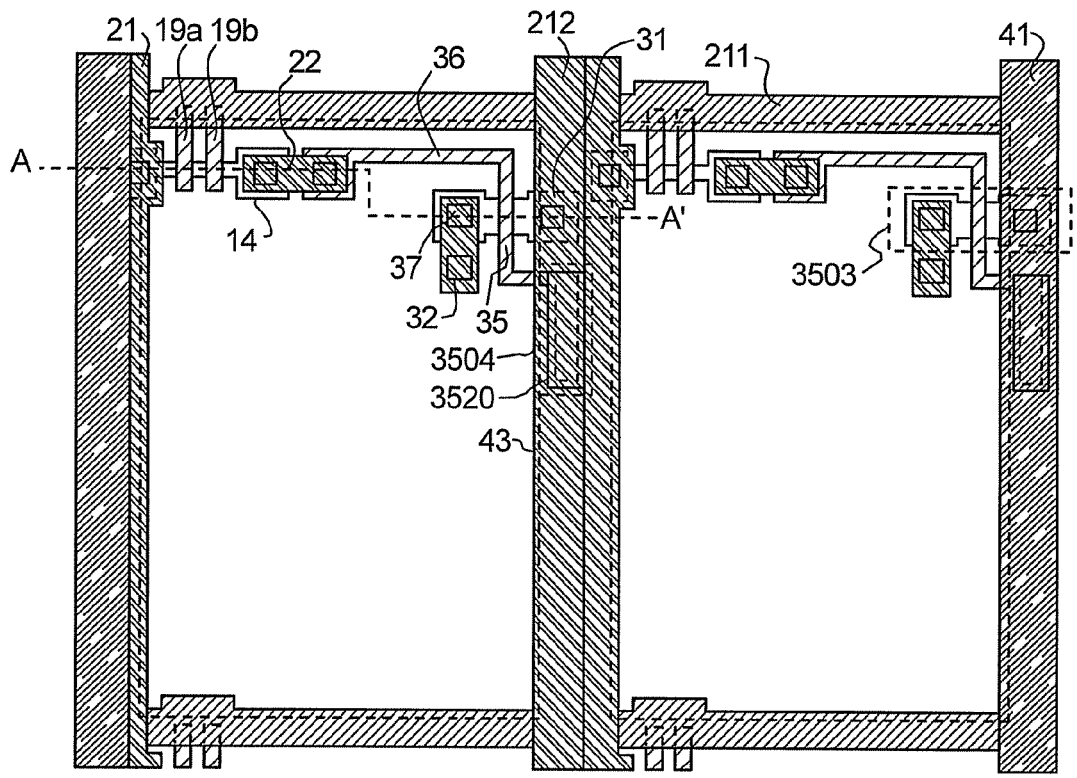
FIGS. 3A and 3B are diagrams showing a top surface structure, and a structure, respectively, of a pixel portion.
Figure 3B:
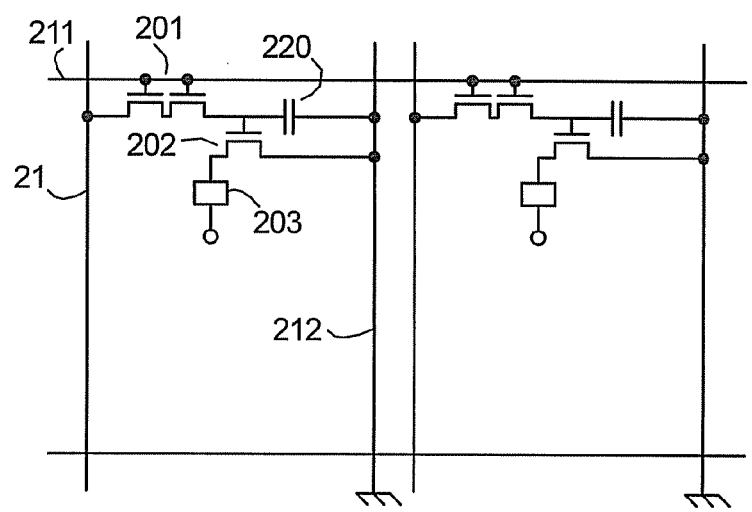

An embodiment mode of the present invention is explained using FIG. 2 and FIGS. 3A and 3B. Shown in FIG. 2 is a cross sectional diagram of a pixel portion of a self-light-emitting device manufactured using a thin film formation apparatus of the present invention. FIG. 3A shows a top surface diagram of the pixel portion, and FIG. 3B is a circuit structure of the pixel portion. In practice, a pixel portion (image display portion) is formed in which pixels are arranged in a matrix and in a plurality of strip shapes. Note that the cross sectional diagram cut along the line segment A-A' of FIG. 3A corresponds to FIG. 2. Common reference symbols are used in FIG. 2 and FIGS. 3A and 3B, and therefore both figures may be suitably referenced. Further, two pixels are shown in the top surface diagram of FIG. 3A, and both have the same structure.

Reference numeral 11 denotes a substrate, and reference numeral 12 denotes an insulating film which becomes a base (hereafter referred to as base film) in FIG. 2. A substrate made from glass, glass ceramic, quartz, silicon, ceramic, a metal, or a plastic can be used as the substrate 11.

Further, although the base film 12 is especially effective for cases in which a substrate containing mobile ions, or a substrate having conductivity is used, it need not be formed for a quartz substrate. An insulating film containing silicon may be formed as the base film 12. Note that, in this specification, the term "insulating film containing silicon" indicates, specifically, an insulating film such as a silicon oxide film, a silicon nitride film, or an oxidized silicon nitride film (denoted by SiOxNy) containing silicon, oxygen, and nitrogen in predetermined ratios.

Further, the dispersion of TFT generated heat by giving the base film 12 a heat radiating effect is effective in preventing TFT degradation and EL element degradation. All known materials can be used in giving the heat radiating effect.

Two TFTs are formed within the pixels here. Reference numeral 201 denotes a switching TFT, formed by an n-channel TFT, and reference numeral 202 denotes an electric current control TFT, formed by an p-channel TFT.

Note that it is not necessary to place limitations on the present invention such that the switching TFT is an n-channel TFT and the electric current control TFT is a p-channel TFT, and that it is possible to form the switching TFT using a p-channel TFT and to form the electric current control TFT using an n-channel TFT. It is also possible to use n-channel TFTs for both, and to use p-channel TFTs for both.

The switching TFT 201 is formed having: an active layer containing a source region 13, a drain region 14, LDD regions 15a to 15d, a high concentration impurity region 16, and channel forming regions 17a and 17b; a gate insulating film 18; gate electrodes 19a and 19b, a first interlayer insulating film 20, a source wiring 21, and a drain wiring 22.

Further, as shown in FIGS. 3A and 3B, this is a double gate structure in which the gate electrodes 19a and 19b are electrically connected by a gate wiring 211 formed by a different material (a material having a lower resistance than the gate electrodes 19a and 19b). Of course, in addition to the double gate structure, a single gate structure or a multi-gate structure (a structure containing an active layer having two or more channel forming regions connected in series), such as a triple gate structure, may also be used. The multi-gate structure is extremely effective in lowering the value of the off current, and a switching element having a low off current value is realized with the present invention by using a multi-gate structure for the switching element 201.

Further, the active layer is formed by a semiconductor film containing a crystal structure. Namely, the active layer may be formed using a single crystal semiconductor film, a polycrystalline semiconductor film, or a microcrystalline semiconductor film. Further, the gate insulating film 18 may be formed by an insulating film containing silicon, and all conducting films can be used for the gate electrodes, the source wiring, and the drain wiring.

In addition, the LDD regions 15a to 15d in the switching TFT 201 are formed sandwiching the gate insulating film 18, and so as not to overlap with the gate electrodes 19a and 19b. Such structure is extremely effective in reducing the off current value.

Note that the formation of an offset region (a region having the semiconductor layer with the same composition as the channel forming regions, and to which a gate voltage is not applied) between the channel forming regions and the LDD regions is additionally preferable for reducing the off current value. Further, when a multi-gate structure having two or more gate electrodes is used, a high concentration impurity region formed between the channel forming regions is effective in lowering the value of the off current.

Next, the current control TFT 202 is formed having: an active layer containing a source region 31, a drain region 32, and a channel forming region 34; the gate insulating film 18; a gate electrode 35; the first interlayer insulating film 20; a source wiring 36; and a drain wiring 37. Note that the gate electrode 35 has a single gate structure, but a multi-gate structure may also be used.

As shown in FIG. 2, the drain of the switching TFT 201 is electrically connected to the gate of the current control TFT 202. Specifically, the gate electrode 35 of the current control TFT 202 is electrically connected to the drain region 14 of the switching TFT 201 through the drain wiring (also referred to as a connection wiring) 22. Further, the source wiring 36 is connected to an electric power supply line 212.

The current control TFT 202 is an element for controlling the amount of current injected into an EL element 203, and if deterioration of the EL element is considered, it is not preferable that too much current flows. It is therefore preferable to design the channel length (L) on the long side, so that an excess current does not flow in the current control TFT 202. The amount of current is preferably from 0.5 to 2 µA (more preferably between 1 and 1.5 µA) per pixel.

The length (width) of the LDD regions formed in the switching TFT 201 may be from 0.5 to 3.5 µm, typically between 2.0 and 2.5 µm.

Further, as shown in FIGS. 3A and 3B, the wiring 36 containing the gate electrode 35 of an electric current control TFT 3503 overlaps the drain wiring 37 of the current control TFT 3503 in a region denoted by reference numeral 3504, sandwiching an insulating film. A storage capacitor is formed in the region denoted by reference numeral 3504 at this point. Regarding the storage capacitor 3504, it is also possible to use a capacitance formed by: a semiconductor film 3520 electrically connected to the electric power source supply line 212; an insulating film (not shown in the figures)

on the same layer as the gate insulating film; and the electric power source supply line 212, as a storage capacitor.

The storage capacitor 3504 functions as a capacitor for storing a voltage applied to the gate electrode 35 of the electric current control TFT 3503.

Further, seen from the viewpoint of increasing the amount of current that is able to flow, it is effective to make the film thickness of the active layer (especially the channel forming region) of the current control TFT 202 thick (preferably from 50 to 100 nm, more preferably between 60 and 80 nm). Conversely, seen from the point of view of making the off current value smaller for the switching TFT 201, it is also effective to make the film thickness of the active layer (especially the channel forming region) thin (preferably from 20 to 50 nm, more preferably between 25 and 40 nm).

Next, reference numeral 38 denotes a first passivation film, and its film thickness may be set from 10 nm to 1 μm (preferably between 200 and 500 nm). An insulating film containing silicon (in particular, it is preferable to use an oxidized silicon nitride film or a silicon nitride film) can be used as the passivation film material.

A second interlayer insulating film (this may also be referred to as a leveling film) 39 is formed on the first passivation film 38 having a shape so as to cover each TFT, and performs leveling of steps due to the TFTs. An organic resin film is preferable as the second interlayer insulating film 39, and one such as polyimide, polyamide, acrylic, and BCB (benzocyclobutene) may be used. An inorganic film may also be used, of course, provided that it is capable of sufficient leveling.

Leveling of steps, due to the TFTs, by the second interlayer insulating film 39 is extremely important. EL layers later formed are extremely thin, and therefore there are cases in which light emission defects are caused by the existence of the steps. Consequently, it is preferable to perform leveling before forming the pixel electrodes so as to be able to form the EL layers on as level a surface as possible.

Further, reference numeral 40 denotes a pixel electrode (corresponding to an anode of the EL element) made from a transparent conducting film. After opening a contact hole in the second interlayer insulating film 39 and in the first passivation film 38, the pixel electrode 40 is formed so as to be connected to the drain wiring 37 of the current control TFT 202 in the formed opening portion.

A conducting thin film of a chemical compound of indium oxide and tin oxide is used as the pixel electrode in the embodiment mode. Further, a small amount of gallium may also be added. In addition, a chemical compound of indium oxide and zinc oxide can also be used.

Banks 41a and 41b are formed from a resin material after forming the pixel electrode. The banks 41a and 41b are may be formed by patterning a 1 to 2 μm thick acrylic film or polyimide film. The banks 41a and 41b are formed in stripe shapes between pixels. In this embodiment, the banks may be formed along the source wiring 21, and they may be formed along the gate wiring 35.

Figure 1A:
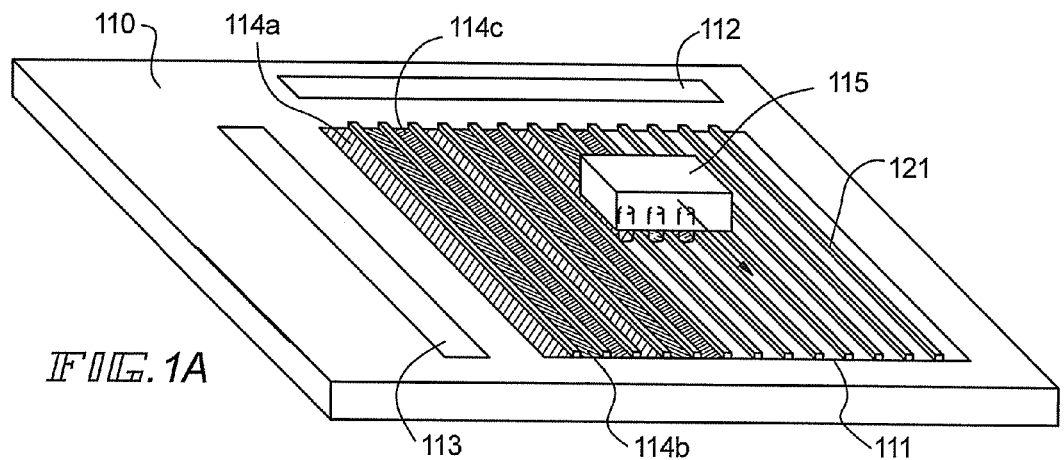
FIGS. 1A to 1C are diagrams showing an organic EL material application process of the present invention.
Figure 1B:
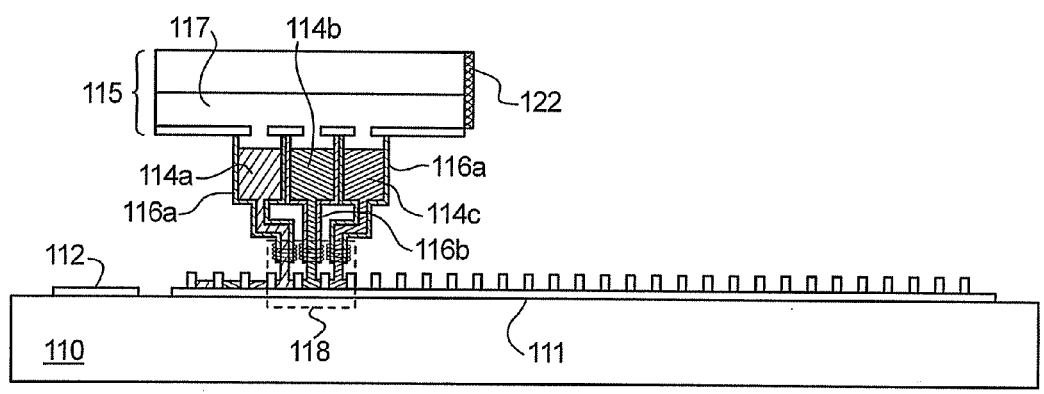
Figure 1C:
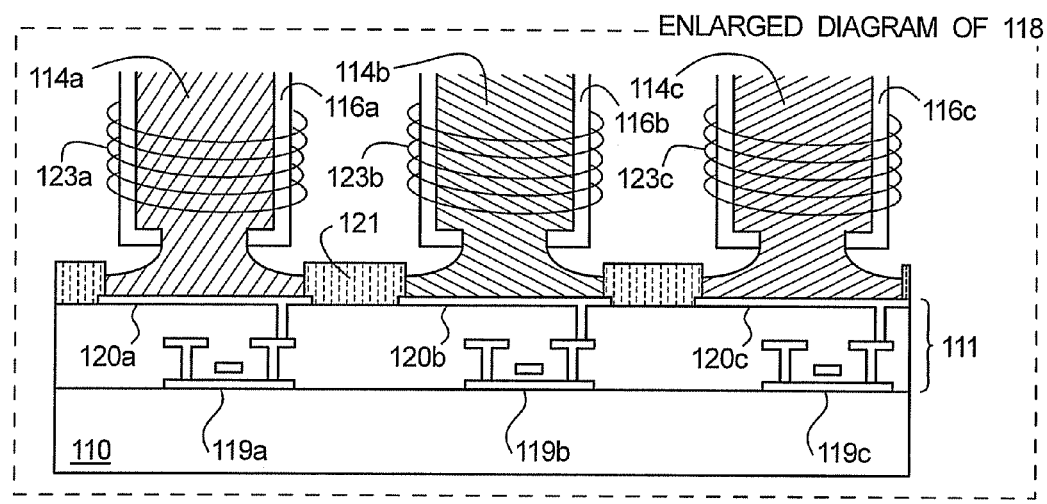

An EL layer 42 is formed next by a thin film formation apparatus like that explained by FIG. 1. Note that, although only one pixel is shown in the figures here, light emitting layers corresponding to each color of R (red), G (green), and B (blue) are formed here at the same time. A polymer material is used as the organic EL material which becomes the EL layer. Polyparaphenylene vinylene (PPV), polyvinyl carbazole (PVK) and polyfluorane can be given as typical polymer materials.

Note that there are various types of PPV organic EL materials, and for example, chemical formulae such as those below have been announced. (See Shenk, H., Becker, H., Gelsen, O., Kluge, E., Kreuder, W., and Spreitzer, H., "Polymers for Light Emitting Diodes", Euro Display, Proceedings, 1999, pp. 33-37.)

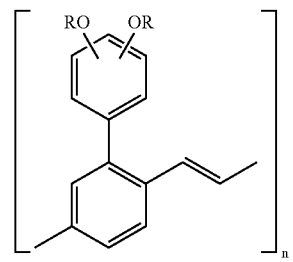

[Chem 1]

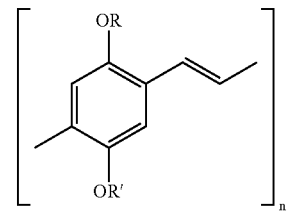

[Chem 2]

Further, polyphenylvinyl having the chemical formula recorded in Japanese Patent Application Laid-open No. Hei 10-92576 can also be used. The chemical formula is as below.

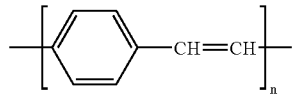

[Chem 3]

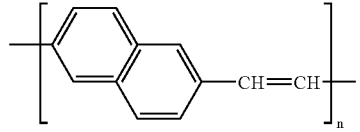

[Chem 4]

In addition, chemical formulae such as that below exist as PVK organic EL materials.

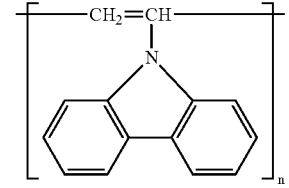

[Chem 5]

The polymer organic EL material can be dissolved in a solvent as a polymer and then applied, and it can be dissolved in a solvent as a monomer and then polymerized after application. When applied as a monomer, first a polymer precursor is formed, and this is polymerized by heating within a vacuum, becoming a polymer.

As specific EL layers, cyano-paraphenylene vinylene may be used in a red color light emitting EL layer; polyphenylene vinylene may be used in a green light emitting EL layer; and polyphenylene vinylene or polyalkylphenylene may be used in a blue color light material. The film thickness may be set from 30 to 150 nm (preferably between 40 and 100 nm).

Note that the above examples are only examples of organic EL materials which can be used as EL layers in the present invention, and it is not necessary to limit the EL layers to these. A mixture of an organic EL material and a solvent is applied in accordance with the method shown in FIG. 1 in the present invention, and an EL layer is formed by vaporizing the solvent to remove it. Therefore, provided that it is a combination in which the glass transition temperature of the EL layer is not exceeded when vaporizing the solvent, all organic EL materials may also be used.

Further, toluene, xylene, chlorobenzene, dichlorobenzene, anisole, chloroform, dichloromethane, γ-butylractone, butyl-cell-solve, dichlorohexane, NMP (N-methyl-2-piloridon), cylclohexanone, dioxane, and THF (tetrahydrofluorane) can be given as specific solvents.

In addition, the EL layer 42 easily degrades in accordance with the existence of hydrogen or oxygen when forming the EL layer 42, and therefore it is preferable to perform film formation within an inert gas, such as nitrogen or argon, as an atmosphere having little hydrogen and oxygen for the process environment. In addition, an environment of the solvent used in the application process may also be used as the process atmosphere because the vaporization speed of the application liquid can be controlled. Note that, in order to perform film formation of the light emitting layers within this atmosphere which is preferable, the thin film formation apparatus of FIG. 1 may be set in a clean booth filled with an inert gas.

After forming the EL layer 42 as above, a cathode 43 made from a shading conducting film, a protecting electrode 44, and a second passivation film 45 are formed next. A conducting film made from MgAg is used as the cathode 43 in this embodiment mode, and a conducting film made from aluminum is used as the protecting electrode 44. Further, a silicon nitride film having a thickness of 10 nm to 1 μm (preferably between 200 and 500 nm) is used as a second passivation film 45.

Note that the EL layers are weak with respect to heat as stated above, and therefore it is preferable to perform film formation of the cathode 43 and the second passivation film 45 at as low a temperature as possible (preferably in the range from room temperature to 120° C.). It can therefore be said that plasma CVD, vacuum evaporation, and solution application (spin coating) are desirable film deposition methods.

That which is thus completed is referred to as an active matrix substrate, and an opposing substrate (not shown in the figures) is formed opposing the active matrix substrate. A glass substrate is used as the opposing substrate in this embodiment mode. Note that a substrate made from plastic or ceramic may also be used as the opposing substrate.

Further, the active matrix substrate and the opposing substrate are joined by a sealant (not shown in the figures), forming an airtight space (not shown in the figures). The airtight space is filled with argon in this embodiment mode. It is also possible, of course, to arrange a drying agent such as barium oxide and arrange an oxidation preventing agent within the airtight space.

Embodiment 1

The embodiments of the present invention are explained using FIGS. 4A to 6C. A method of simultaneous manufacturing of a pixel portion, and TFTs of a driver circuit portion formed in the periphery of the pixel portion, is explained here. Note that in order to simplify the explanation, a CMOS circuit is shown as a basic circuit for the driver circuits.

First, as shown in FIG. 4A, a base film 301 is formed with a 300 nm thickness on a glass substrate 300. A 100 nm silicon oxynitride film and a 200 nm silicon oxynitride film are laminated as the base film 301 in embodiment 1. It is good to set the nitrogen concentration at between 10 and 25 wt % in the film contacting the glass substrate 300. Of course, an element can be formed on the carbon substrate directly without providing the base film.

Next, an amorphous silicon film (not shown in the figures) is formed with a thickness of 50 nm on the base film 301 by a known deposition method. Note that it is not necessary to limit this to the amorphous silicon film, and another film may be formed provided that it is a semiconductor film containing an amorphous structure (including a microcrystalline semiconductor film). In addition, a compound semiconductor film containing an amorphous structure, such as an amorphous silicon-germanium film, may also be used. Further, the film thickness may be made from 20 to 100 nm.

The amorphous silicon film is then crystallized by a known method, forming a crystalline silicon film (also referred to as a polycrystalline silicon film or a polysilicon film) 302. Thermal crystallization using an electric furnace, laser annealing crystallization using a laser, and lamp annealing crystallization using an infrared lamp exist as known crystallization methods. Crystallization is performed in this embodiment using an excimer laser light which uses XeCl gas.

Note that pulse emission type excimer laser light formed into a linear shape is used in this embodiment, but a rectangular shape may also be used, and continuous emission argon laser light and continuous emission excimer laser light can also be used.

In this embodiment, although the crystalline silicon film is used as the active layer of the TFT, it is also possible to use an amorphous silicon film. Further, it is possible to form the active layer of the switching TFT, in which there is a necessity to reduce the off current, by the amorphous silicon film, and to form the active layer of the current control TFT by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Next, as shown in FIG. 4B, a protective film 303 is formed on the crystalline silicon film 302 with a silicon oxide film having a thickness of 130 nm. This thickness may be chosen within the range of 100 to 200 nm (preferably between 130 and 170 nm). Furthermore, other films may also be used providing that they are insulating films containing silicon. The protective film 303 is formed so that the crystalline silicon film is not directly exposed to plasma during addition of an impurity, and so that it is possible to have delicate concentration control of the impurity.

Resist masks 304a and 304b are then formed on the protective film 303, and an impurity element which imparts n-type conductivity (hereafter referred to as an n-type impurity element) is added via the protective film 303. Note that elements residing in periodic table group 15 are generally used as the n-type impurity element, and typically phosphorous or arsenic can be used. Note that a plasma (ion) doping method is used, in which phosphine ($PH_3$) is plasma activated without separation of mass, and phosphorous is added at a concentration of $1\times10^{18}$ atoms/$cm^3$ in this embodiment.

An ion implantation method, in which separation of mass is performed, may also be used, of course.

The dose amount is regulated so that the n-type impurity element is contained in n-type impurity regions 305, thus formed by this process, at a concentration of $2\times10^{16}$ to $5\times10^{19}$ atoms/cm$^3$ (typically between $5\times10^{17}$ and $5\times10^{18}$ atoms/cm$^3$).

Next, as shown in FIG. 4C, the protective film 303, resist masks 304a and 304b are removed, and an activation of the added periodic table group 15 elements is performed. A known technique of activation may be used as the means of activation, but activation is done in this embodiment by irradiation of excimer laser light. Of course, a pulse emission type excimer laser and a continuous emission type excimer laser may both, be used, and it is not necessary to place any limits on the use of excimer laser light. The goal is the activation of the added impurity element, and it is preferable that irradiation is performed at an energy level at which the crystalline silicon film does not melt. Note that the laser irradiation may also be performed with the protective film 303 in place.

The activation by heat treatment may also be performed along with activation of the impurity element by laser light. When activation is performed by heat treatment, considering the heat resistance of the substrate, it is good to perform heat treatment on the order of 450 to 550° C.

A boundary portion with end portions of the n-type impurity regions 305, namely regions, in which the n-type impurity element is not added, on the periphery of the n-type impurity regions 305, is not added, is delineated by this process. This means that, at the point when the TFTs are later completed, extremely good connections can be formed between LDD regions and channel forming regions.

Unnecessary portions of the crystalline silicon film are removed next, as shown in FIG. 4D, and island shape semiconductor films (hereafter referred to as active layers) 306 to 309 are formed.

Then, as shown in FIG. 4E, a gate insulating film 310 is formed, covering the active layers 306 to 309. An insulating film containing silicon and with a thickness of 10 to 200 nm, preferably between 50 and 150 nm, may be used as the gate insulating film 310. A single layer structure or a lamination structure may be used. A 110 nm thick silicon oxynitride film is used in this embodiment.

Thereafter, a conductive film having a thickness of 200 to 400 nm is formed and patterned to form gate electrodes 311 to 315. Respective end portions of these gate electrodes 311 to 315 may be tapered. In the present embodiment, the gate electrodes and wirings (hereinafter referred to as the gate wirings) electrically connected to the gate electrodes for providing lead wires are formed of different materials from each other. More specifically, the gate wirings are made of a material having a lower resistivity than the gate electrodes. Thus, a material enabling fine processing is used for the gate electrodes, while the gate wirings are formed of a material that can provide a smaller wiring resistance but is not suitable for fine processing. It is of course possible to form the gate electrodes and the gate wirings with the same material.

Although the gate electrode can be made of a single-layered conductive film, it is preferable to form a lamination film with two, three or more layers for the gate electrode if necessary. Any known conductive materials can be used for the gate electrode. It should be noted, however, that it is preferable to use such a material that enables fine processing, and more specifically, a material that can be patterned with a line width of 2 μm or less.

Typically, it is possible to use a film made of an element selected from tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy, Mo—Ta alloy), or a silicide film of the above element (typically a tungsten silicide film or titanium silicide film). Of course, the films may be used as a single layer or a laminate layer.

In this embodiment, a laminate film of a tantalum nitride (TaN) film having a thickness of 50 nm and a tantalum (T) film having a thickness of 350 nm is used. This may be formed by a sputtering method. When an inert gas of Xe, Ne or the like is added as a sputtering gas, film peeling due to stress can be prevented.

The gate electrodes 312 are formed at this time so as to overlap a portion of the n-type impurity regions 305, respectively, sandwiching the gate insulating film 310. This overlapping portion later becomes an LDD region overlapping the gate electrode. The gate electrodes 313 and 314 seem to be two electrodes by a cross sectional views but actually they are connected each other electrically.

Next, an n-type impurity element (phosphorous in this embodiment) is added in a self-aligning manner with the gate electrodes 311 to 315 as masks, as shown in FIG. 5A. The addition is regulated so that phosphorous is added to impurity regions 316 to 323 thus formed at a concentration of 1/10 to 1/2 that of the impurity regions 305 (typically between 1/4 and 1/3). Specifically, a concentration of $1\times10^{16}$ to $5\times10^{18}$ atoms/cm$^3$ (typically $3\times10^{17}$ to $3\times10^{18}$ atoms/cm$^3$) is preferable.

Resist masks 324a to 324d are formed next, with a shape covering the gate electrodes etc., as shown in FIG. 5B, and an n-type impurity element (phosphorous is used in this embodiment) is added, forming impurity regions 325 to 329 containing high concentration of phosphorous. Ion doping using phosphine (PH$_3$) is also performed here, and is regulated so that the phosphorous concentration of these regions is from $1\times10^{20}$ to $1\times10^{21}$ atoms/cm$^3$ (typically between $2\times10^{20}$ and $5\times10^{21}$ atoms/cm$^3$).

A source region or a drain region of the n-channel type TFT is formed by this process, and in the switching TFT, a portion of the n-type impurity regions 319 to 321 formed by the process of FIG. 5A are remained. These remaining regions correspond to the LDD regions 15a to 15d of the switching TFT 201 in FIG. 2.

Next, as shown in FIG. 5C, the resist masks 324a to 324d are removed, and a new resist mask 332 is formed. A p-type impurity element (boron is used in this embodiment) is then added, forming impurity regions 333 and 336 containing boron at high concentration. Boron is added here to form impurity regions 333 and 336 at a concentration of $3\times10^{20}$ to $3\times10^{21}$ atoms/cm$^3$ (typically between $5\times10^{20}$ and $1\times10^{21}$ atoms/cm$^3$) by ion doping using diborane (B$_2$H$_6$).

Note that phosphorous has already been added to the impurity regions 333 and 336 at a concentration of $1\times10^{20}$ to $1\times10^{21}$ atoms/cm$^3$, but boron is added here at a concentration of at least three times more than that of the phosphorous. Therefore, the n-type impurity regions already formed completely invert to p-type, and function as p-type impurity regions.

Next, after removing the resist mask 332, the n-type and p-type impurity elements added to the active layer at respective concentrations are activated. Furnace annealing, laser annealing or lamp annealing can be used as a means of activation. In this embodiment, heat treatment is performed for 4 hours at 550° C. in a nitrogen atmosphere in an electric furnace.

At this time, it is critical to eliminate oxygen from the surrounding atmosphere as much as possible. This is because when even only a small amount of oxygen exists, an exposed surface of the gate electrode is oxidized, which results in an increased resistance and later makes it difficult to form an ohmic contact with the gate electrode. Accordingly, the oxygen concentration in the surrounding atmosphere for the activation process is set at 1 ppm or less, preferably at 0.1 ppm or less.

After the activation process is completed, the gate wiring 337 having a thickness of 300 nm is formed as shown in FIG. 5D. As a material for the gate wiring 337, a metal film containing aluminum (Al) or copper (Cu) as its main component (occupied 50 to 100% in the composition) can be used. The gate wiring 337 is arranged, as the gate wiring 211 shown in FIG. 3, so as to provide electrical connection for the gate electrodes 19a and 19b (corresponding to the gate electrodes 313 and 314 in FIG. 4E) of the switching TFT.

The above-described structure can allow the wiring resistance of the gate wiring to be significantly reduced, and therefore, an image display region (pixel portion) with a large area can be formed. More specifically, the pixel structure in accordance with the present embodiment is advantageous for realizing a self-light-emitting type device having a display screen with a diagonal size of 10 inches or larger (or 30 inches or larger.)

A first interlayer insulating film 338 is formed next, as shown in FIG. 6A. A single layer insulating film containing silicon is used as the first interlayer insulating film 338, while a lamination film, which is a combination of insulating film including two or more kinds of silicon, may be used. Further, a film thickness of between 400 nm and 1.5 μm may be used. A lamination structure of an 800 nm thick silicon oxide film on a 200 nm thick silicon oxynitride film is used in this embodiment.

In addition, heat treatment is performed for 1 to 12 hours at 300 to 450° C. in an atmosphere containing between 3 and 100% hydrogen, performing hydrogenation. This process is one of hydrogen termination of dangling bonds in the semiconductor film by hydrogen which is thermally activated. Plasma hydrogenation (using hydrogen activated by a plasma) may also be performed as another means of hydrogenation.

Note that the hydrogenation processing may also be inserted during the formation of the first interlayer insulating film 338. Namely, hydrogen processing may be performed as above after forming the 200 nm thick silicon oxynitride film, and then the remaining 800 nm thick silicon oxide film may be formed.

Next, a contact hole is formed in the first interlayer insulating film 338 and the gate insulating film 310, and source wiring lines 339 to 342 and drain wiring lines 343 to 345 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by a sputtering method. Of course, other conductive films may be used.

A first passivation film 346 is formed next with a thickness of 50 to 500 nm (typically between 200 and 300 nm). A 300 nm thick silicon oxynitride film is used as the first passivation film 346 in this embodiment. This may also be substituted by a silicon nitride film.

Note that it is effective to perform plasma processing using a gas containing hydrogen such as $H_2$ or $NH_3$ etc. before the formation of the silicon oxynitride film. Hydrogen activated by this preprocess is supplied to the first interlayer insulating film 338, and the film quality of the first passivation film 346 is improved by performing heat treatment. At the same time, the hydrogen added to the first interlayer insulating film 338 diffuses to the lower side, and the active layers can be hydrogenated effectively.

Next, as shown in FIG. 6B, a second interlayer insulating film 347 made of organic resin is formed. As the organic resin, it is possible to use polyimide, polyamide, acryl, BCB (benzocyclobutene) or the like. Especially, since the second interlayer insulating film 347 is primarily used for flattening, acryl excellent in flattening properties is preferable. In this embodiment, an acrylic film is formed to a thickness sufficient to flatten a stepped portion formed by TFTs. It is appropriate that the thickness is made 1 to 5 μm (more preferably, 2 to 4 μm).

Thereafter, contact holes are made in the second interlayer insulating film 347 and the first passivation film 346, and then a pixel electrode 348 that connect electrically to the drain wiring line 345 is formed. In this embodiment, the indium tin oxide film (ITO) is formed as a pixel electrode by forming to be 110 nm thick and patterned. A transparent conductive film can be used in which zinc oxide (ZnO) of 2-20% is mixed with indium oxide film also can be used. This pixel electrode is an anode of an EL element.

Next, as shown in FIG. 6C, a bank 349 made of resin material is formed. The bank 349 may be formed by patterning a 1 to 2 μm thick acrylic film or polyimide film. As shown in FIG. 3, the bank 349 is formed as a stripe shape between pixels. In Embodiment 1, the bank 349 is formed along the source wiring 341, but it may also be formed along the gate wiring 337.

An EL layer 350 is next formed by the film deposition process employing the thin film deposition apparatus explained with reference to FIG. 1. Specifically, an organic EL material that becomes the EL layer 350 is dissolved in a solvent such as chloroform, dichloromethane, xylene, toluene, tetrahydrofuran and N-metylepyrrolidone, and is then applied. Thereafter, heat treatment is performed to volatilize the solvent. A film (EL layer) made of the organic EL material is thus formed.

It is to be noted that only one pixel is illustrated in Embodiment 1. However, a light emitting layer luminescing red color, an EL layer luminescing green color, and an EL layer luminescing blue color are all formed at the same time at this point. In Embodiment 1, a cyano-polyphenylene vinylene is used for forming the EL layer luminescing red color, a polyphenylene vinylene for the EL layer luminescing green color, and a polyalkylphenylene for the EL layer luminescing blue color. Each of these EL layers is formed to a thickness of 50 nm. In addition, 1.2 dichloromethane is used as a solvent, and then volatilized by performing heat treatment on a hot plate at 80 to 150° C. for 1 to 5 minutes.

A known material can be used for the EL layer 350. Preferably, that is an organic material in consideration of driving voltage. In this embodiment the EL layer 350 is formed by with a single structure. The EL layer 350 can also be formed with a four-layer structure when necessary consisting of an electronic injection layer, an electronic transporting layer, a hole transporting layer, a hole injection layer, an electronic stop layer or a hole element layer. In this embodiment, an example of using MgAg electrode as a cathode of an EL element 351, although other well-known material also can be used.

After forming the EL layer 350, the cathode (MgAg electrode) 351 formed using a vacuum deposition method. The thickness of the EL layer 350 can make 80 to 200 nm (typically 100 to 120 nm), the thickness of the cathode 351 can make 180 to 300 nm (typically 200 to 250 nm).

The protective electrode 352 is formed on the cathode 351. As a protective electrode 352, the conductive layer, which contains aluminum as a main component, can be used. The protective electrode 352 is formed using a vacuum deposition method with mask.

Lastly, a second passivation film 353 of a silicon nitride film is formed to be 300 nm thick. Practically, a protective electrode 352 fills the role of protecting EL layer from water. Furthermore, the reliability of an EL element can be improved by forming the second passivation film 353.

In the case of this embodiment, as shown in FIG. 6C, the active layer of the n-channel TFT 205 includes a source region 355, a drain region 356, an LDD region 357 and a channel formation region 358, and the LDD region 357 overlaps with the gate electrode 312, putting the gate insulating film 310 therebetween.

Consideration not to drop the operation speed is the reason why the LDD region is formed at only the drain region side. In this n-channel TFT 205, it is not necessary to pay much attention to an off current value, rather, it is better to give importance to an operation speed. Thus, it is desirable that the LDD region 357 is made to completely overlap with the gate electrode to decrease a resistance component to a minimum. That is, it is preferable to remove the so-called offset.

An active matrix substrate having a structure as shown in FIG. 6C is thus completed. Note that after the formation of the bank 349, it is effective to use the multi-chamber method (or the in-line method) of the thin film deposition apparatus for the process of forming the films until the formation of the passivation film 353, in succession and without exposure to the atmosphere.

In the active matrix substrate of the present embodiment, TFTs having optimal structures are arranged not only in the pixel portion but also in the driver circuit portion, thereby indicating an extremely high reliability and increasing its operation performance.

First, a TFT having a structure to decrease hot carrier injection so as not to drop the operation speed thereof as much as possible is used as an n-channel TFT 205 of a CMOS circuit forming a driver circuit portion. Note that the driver circuit here includes a shift register, a buffer, a level shifter, a sampling circuit (sample and hold circuit) and the like. In the case where digital driving is made, a signal conversion circuit such as a D/A converter can also be included.

Note that, among the driver circuits, the sampling circuit is somewhat unique compared to the other circuits, in which a large electric current flows in both directions in the channel forming region. Namely, the roles of the source region and the drain region are interchanged. In addition, it is necessary to control the value of the off current to be as small as possible, and with that in mind, it is preferable to use a TFT having functions which are on an intermediate level between the switching TFT and the current control TFT in the sampling circuit.

Figure 7:
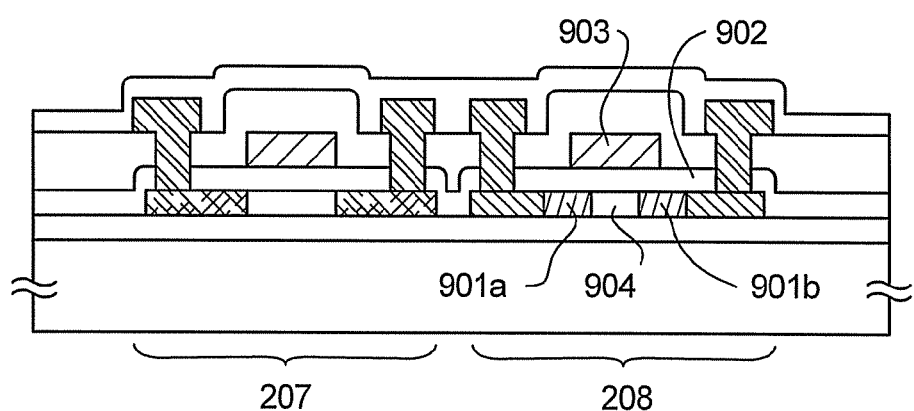
FIG. 7 is a diagram showing an element structure of a sampling circuit.

Accordingly, in the n-channel TFT for forming the sampling circuit, it is desirable to arrange the TFTs having the structure as shown in FIG. 7. As illustrated in FIG. 7, portions of the LDD regions 901a and 901b overlap the gate electrode 903 through the gate insulating film 902. The effect by this structure can be a countermeasure of the deterioration by hot carrier injection by flowing a electric current. In the case where the TFT is used for the sampling circuit, the LDD regions are disposed to interpose the channel forming region 904 therebetween, which is different from the case of the current control TFT.

Note that, in practice, it is preferable to additionally perform packaging (sealing) after completing up through FIG. 6C by using a highly airtight protective film which has very little gas leakage such as a glass, quartz or plastic etc., so that there is no exposure to the atmosphere. By making the inside of the sealing material an inert environment, and by placing a drying agent, for example barium oxide, within the sealing material.

Furthermore, after the airtightness is increased by the packing processing etc., a connector (a flexible printed circuit, FPC) for connecting output terminals from elements or circuits formed on the substrate and external signal terminals, is attached, completing a manufactured product. The completed manufactured product in this state of being able to be shipped is referred to as a self-light-emitting type device (or an EL module) throughout this specification.

Here, the structure of the active matrix self-light-emitting type device of this embodiment will be described with reference to a perspective view of FIG. 8. The active matrix EL display device of this embodiment is constituted by a pixel portion 602, a gate side driver circuit 603, and a source side driver circuit 604 formed on a glass substrate 601. A switching TFT 605 of a pixel portion is an n-channel TFT, and is disposed at an intersection point of a gate wiring 606 connected to the gate side driver circuit 603 and a source wiring 607 connected to the source side driver circuit 604. The drain of the switching TFT 605 is connected to the gate of a current control TFT 608.

In addition, the source of the current control TFT 608 is connected to a current supply line 609. A ground electric potential (earth electric potential) is imparted to the current supply line 609 in the structure such as Embodiment 1. Further, an EL element 610 is connected to the drain of the current control TFT 608. A predetermined voltage (between 3 and 12 V, preferably between 3 and 5 V) is applied to the anode of the EL element 610.

Connection wirings 612 and 613 for transmitting signals to the driver circuit portion and a connection wiring 614 connected to the current supply line 609 are provided in an FPC 611 as an external input/output terminal.

Figure 8:
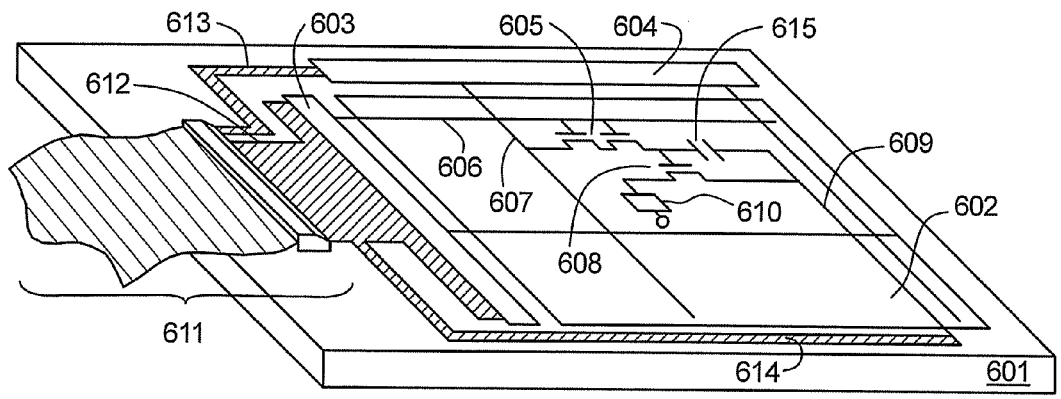
FIG. 8 is a diagram showing an external view of a self-light-emitting device.
Figure 9:
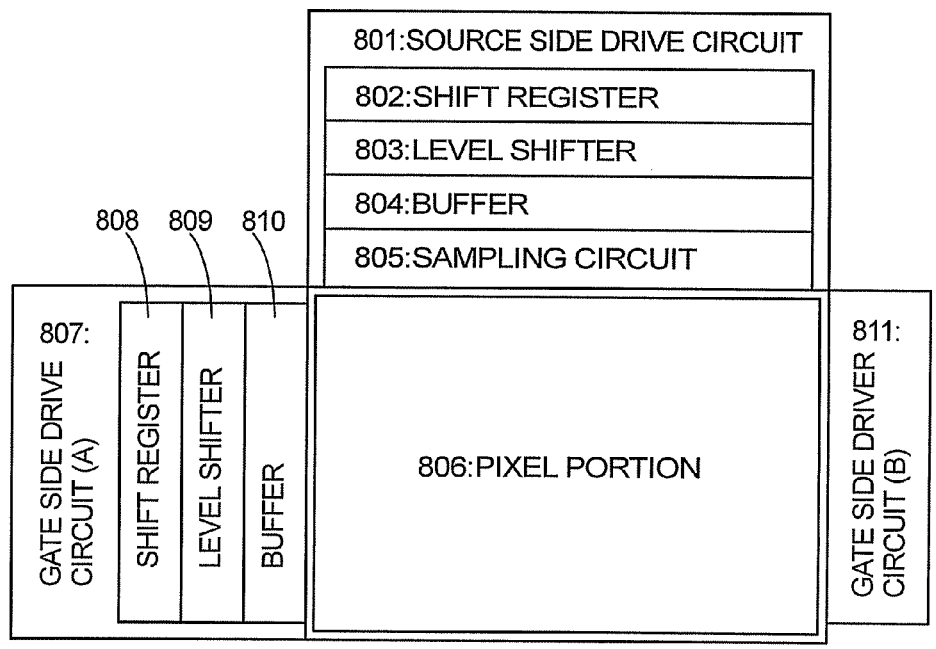
FIG. 9 is a diagram showing a circuit block structure of a self-light-emitting device.

FIG. 8 shows an example of the circuit structure of the self-light-emitting device shown in FIG. 9. The self-light-emitting device of the present embodiment is provided with a source side driver circuit 801, a gate side driver circuit (A) 807, a gate side driver circuit (B) 811 and a pixel portion 806. Note that, throughout the present specification, the driver circuit portion is the generic name for the source side driver circuit and the gate side driver circuits.

The source side driver circuit 801 is provided with a shift register 802, a level shifter 803, a buffer 804, and a sampling circuit (sample and hold circuit) 805. The gate side driver circuit (A) 807 is provided with a shift register 808, a level shifter 809, and a buffer 810. The gate side driver circuit (B) 811 also has the same structure.

Here, the shift registers 802 and 808 have driving voltages of 5 to 16 V (typically 10 V) respectively, and the structure indicated by 205 in FIG. 6C is suitable for an n-channel TFT used in a CMOS circuit forming the circuit.

Besides, for each of the level shifters 803 and 809 and the buffers 804 and 810, similarly to the shift register, the CMOS circuit including the n-channel TFT 205 of FIG. 6C is suitable. Note that it is effective to make a gate wiring a multi-gate structure such as a double gate structure or a triple gate structure in improving reliability of each circuit.

Besides, since the source region and the drain region are inverted and it is necessary to decrease an OFF current value, a CMOS circuit including the n-channel TFT 208 of FIG. 7 is suitable for the sampling circuit 805.

The pixel portion 806 is disposed with pixels having the structure shown in FIG. 2.

The foregoing structure can be easily realized by manufacturing TFTs in accordance with the manufacturing processes shown in FIGS. 4A to 6C. In this embodiment, although only the structure of the pixel portion and the driver circuit portion is shown, if the manufacturing processes of this embodiment are used, it is possible to form a logical circuit other than the driver circuit, such as a signal dividing circuit, a D/A converter circuit, an operational amplifier circuit, a g-correction circuit, on the same substrate, and further, it is considered that a memory portion, a microprocessor, or the like can be formed.

Furthermore, an explanation of the EL module of Embodiment 1, containing the sealing material, is made using FIGS. 10A and 10B. Note that, when necessary, the symbols used in FIGS. 8 and 9 are cited.

FIG. 10A is a diagram showing the top view of a state in which the state shown in FIG. 8 is provided with a sealing structure. Indicated by dotted lines, reference numeral 602 denotes a pixel portion, 603 denotes a gate side driver circuit, and 604 denotes a source side driver circuit. The sealing structure of the present invention is a structure in which a filling material (not shown in the figure), a cover material 1101, a seal material (not shown in the figure), and a frame material 1102 is provided to the state shown in FIG. 8.

Here, the cross-sectional view taken along line A-A of FIG. 10A is shown in FIG. 10B. It is to be noted that the same reference numerals are used for the same components in FIGS. 10A and 10B.

As shown in FIG. 10B, the pixel portion 602 and the gate side driver circuit 603 are formed on the substrate 601. The pixel portion 602 is formed of a plurality of pixels containing the current control TFT 202 and the pixel electrode 348 which is electrically connected to the current control TFT 202. Further, the gate side driver circuit 603 is formed by using a CMOS circuit that is a complementary combination of the n-channel TFT 205 and the p-channel TFT 206.

The pixel electrode 348 functions as the anode of the EL element. In addition, the bank 349 is formed on both ends of the pixel electrode 348, and the EL layer 350 and the cathode 351 are formed on the inner side of the bank 349. The protective electrode 352 and the second passivation film 353 are further formed on the top. As explained in the embodiment mode of the present invention, the EL element may of course have a reverse structure with the pixel electrode as the cathode.

In the case of Embodiment 1, the protective electrode 352 also functions as a common wiring to all the pixels, and is electrically connected to the FPC 611 through the connection wiring 612. Furthermore, all the elements contained in the pixel portion 602 and the gate side driver circuit 603 are covered by the second passivation film 353. The second passivation film 353 may be omitted, but it is preferable to provide this film to shield the respective elements from the outside.

Next, a filling material 1103 is provided so as to cover the EL element. The filling material 1103 also functions as an adhesive for gluing the housing material 1101. As the filling material 1103, PVC (polyvinyl chloride), epoxy resins, silicon resins, PVB (polyvinyl butyral) or EVA (ethylene vinyl acetate) can be used. It is preferable to place a drying agent (not shown in the figure) inside the filling material 1103 because the absorbent effect can be maintained. At this point, the drying agent may be an agent doped into the filling material, or an agent enclosed in the filling material.

Further, in Embodiment 1, materials made of glass, plastic, and ceramic can be used as the housing material 1101. Note that it is effective to dope a drying agent, such as barium oxide, into the filling material 1103 in advance.

After using the filling material 1103 to glue the housing material 1101, the frame material 1102 is next attached so as to cover a side surface (the exposed surface) of the filling material 1103. The frame material 1102 is glued on by the seal material (functioning as an adhesive) 1104. At this point, it is preferable to use a light cured resin as the seal material 1104. However, a thermally cured resin, as long as the heat resistance of the EL layer permits, may be used. Note that it is desirable to use, as the seal material 1104, a material through which, as much as possible, oxygen and moisture do not penetrate. In addition, a drying agent may be doped into the seal material 1104.

The EL element can be completely cutoff from the outside by filling the EL element with the filler material 1103 using the above method, and substances such as moisture and oxygen from the outside, which invite deterioration due to oxidation, can be prevented from penetrating. A self-light-emitting device having high reliability can therefore be manufactured. Note that, although an example of forming three types of stripe shape EL layers which emit red color light, blue color light, or green color light at the same time in a vertical direction or a horizontal direction is shown in Embodiment 1, the stripe shape EL layers may also be formed as divided into a plurality in a longitudinal direction.

Further, an example of forming the red color light emitting EL layer, the green color light emitting EL layer, and the blue color light emitting EL layer all by using the thin film formation apparatus of FIG. 1, but only at least one of the red color, green color, and blue color EL layers need be formed using the thin film formation apparatus of FIG. 1.

Embodiment 2

Figure 11A:
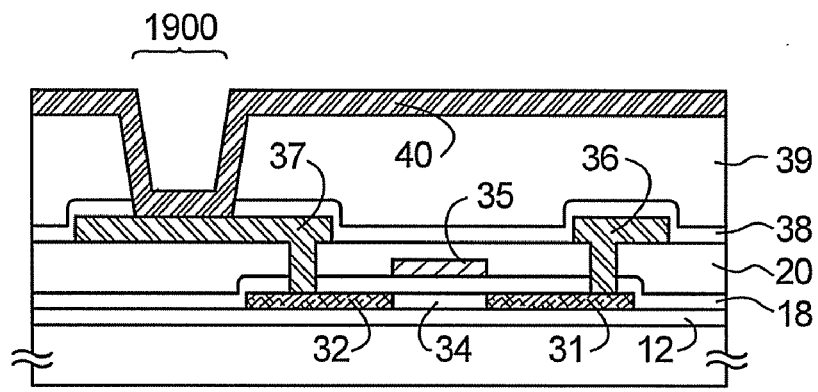
FIGS. 11A to 11C are diagrams showing cross sectional structures of a pixel portion of a self-light-emitting device.

A method of manufacture which adds improvements to the contact structure in the pixel portion explained in FIG. 2 is explained next using the cross sectional diagrams of FIGS. 11A to 11C. Note that the reference numerals in FIGS. 11A to 11C correspond with the reference numerals in FIG. 2. A state in which the pixel electrode (anode) 40 structuring an EL element is obtained as shown in FIG. 11A, in accordance with the processes of Embodiment 1.

Figure 11B:
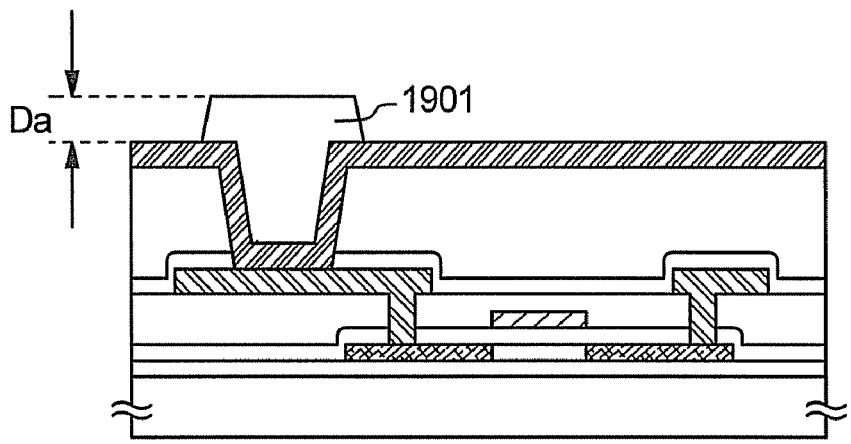

A contact portion 1900 on the pixel electrode is next filled in by acrylic, forming a contact hole protecting portion 1901, as shown in FIG. 11B.

Acrylic is formed into a film by spin coating here, and the contact hole protecting portion 1901 is formed as shown in FIG. 11B by performing etching after exposure using a resist mask.

Note that the contact hole protecting portion 1901 may have a thickness from 0.1 to 1 µm, preferably from 0.1 to 0.5 µm, and even better between 0.1 and 0.3 µm, in a portion sticking up from the pixel electrode as seen from the cross section (a portion denoted by reference symbol Da in FIG. 11B). The EL layer 42 is formed after forming the contact hole protecting portion 1901, and in addition, the cathode 43 is formed, as shown in FIG. 11C. A method similar to that of Embodiment 1 may be used for the method of manufacturing the EL layer 42 and the cathode 43.

Further, it is preferable to use an organic resin in the contact hole protecting portion 1901, and materials such as polyimide, polyamide, acrylic, and BCB (benzocyclobutene) may be used.

In addition, the viscosity when using these organic resins may be set from $10^{-3}$ to $10^{-1}$ Pa·s.

Figure 11C:
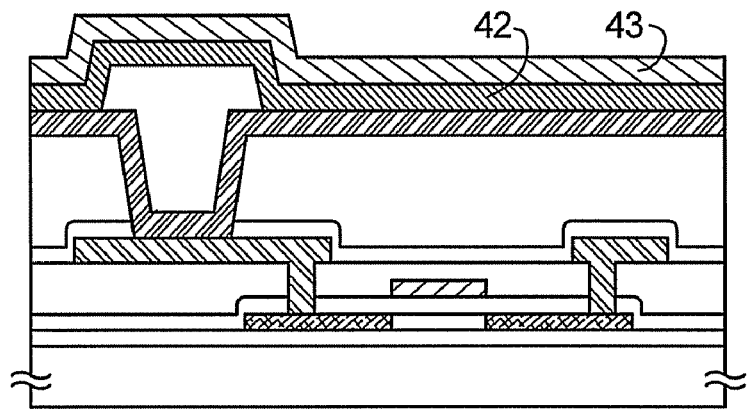
Figure 12:
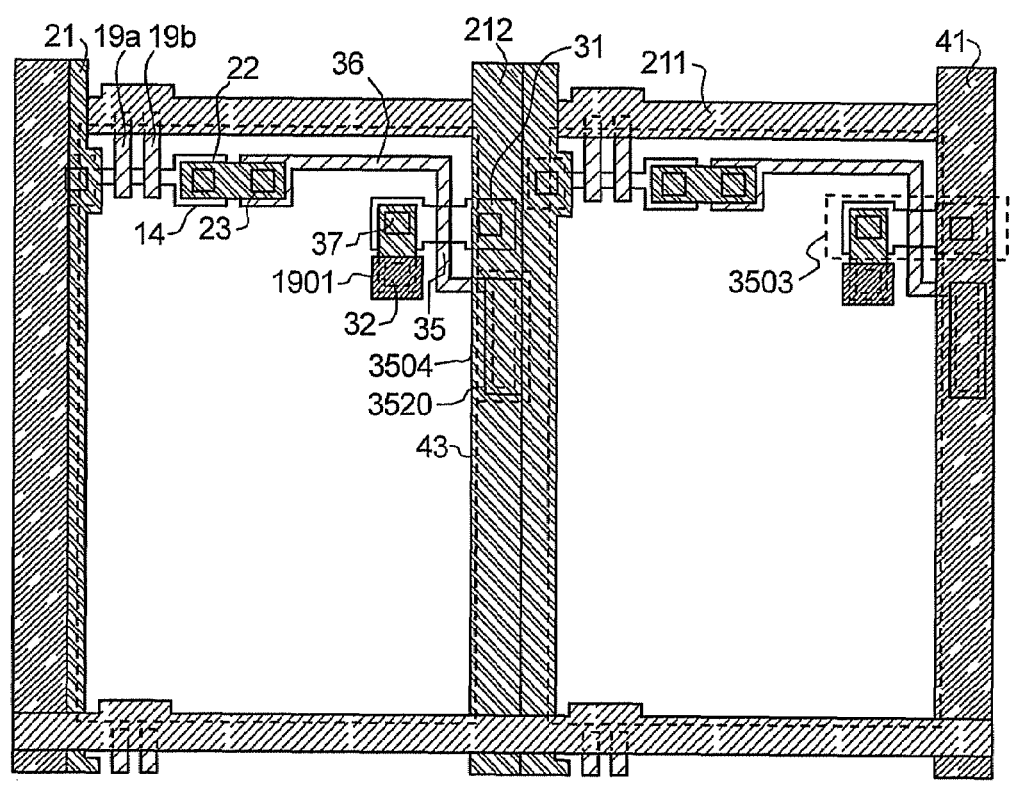
FIG. 12 is a diagram showing a top surface structure of a pixel portion.

A problem of a short circuit between the pixel electrode 40 and the cathode 43 which develops when the EL layer 42 is cut can thus be solved by a contact hole step portion by using a structure like that shown in FIG. 11C. Further, a top surface view of the pixel portion shown by FIGS. 11A to 11C is shown in FIG. 12. Note that the reference numerals used by FIG. 12 conform with those of FIGS. 11A to 11C, and that when the contact hole protecting portion 1901 shown by Embodiment 2 is seen by a top surface view, it coincides with the position shown by reference numeral 1901 of FIG. 12.

Further, the constitution of Embodiment 2 can be freely combined with the constitution of Embodiment 1.

Embodiment 3

A pressurized type application method in which an application liquid is discharged onto a pixel portion from each nozzle by pressurizing the application liquid when implementing the present invention to form EL layers is shown in Embodiment 1. In Embodiment 3, an example of using a fountain pen type application method utilizing capillary action, in which each nozzle is made from one flexible, fine tube, and in which an application liquid is discharged onto a pixel portion in accordance with the contact element contacting a bank of the pixel portion is explained in Embodiment 3.

Figure 13A:
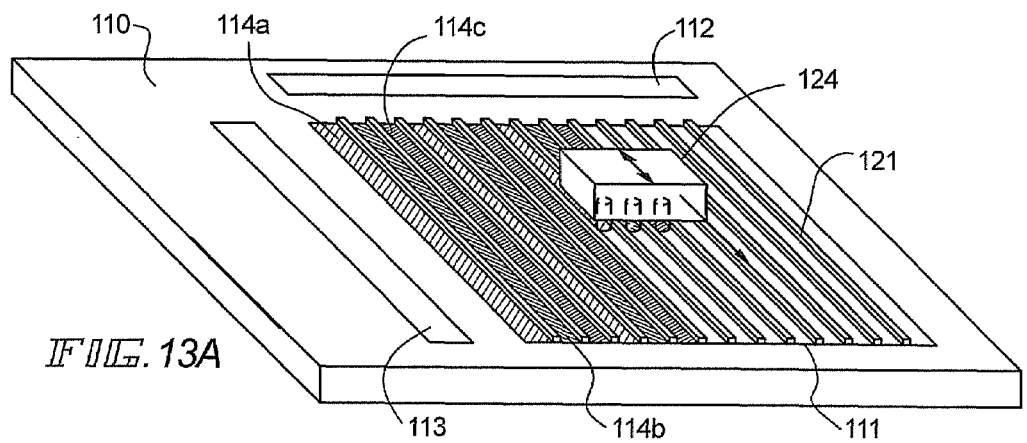
FIGS. 13A to 13C are diagrams showing an organic EL material application process of the present invention.

As shown in FIG. 13A the pixel portion 111, the source side driver circuit 112, and the gate side driver circuit 113 are formed on the substrate 110 by TFTs, and the pixel portion 111 is divided into stripe shapes by the banks 121.

Figure 13B:
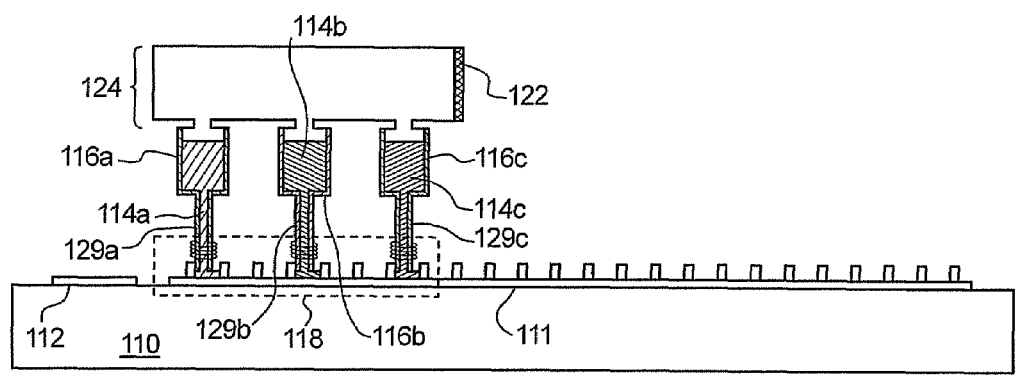
Figure 13C:
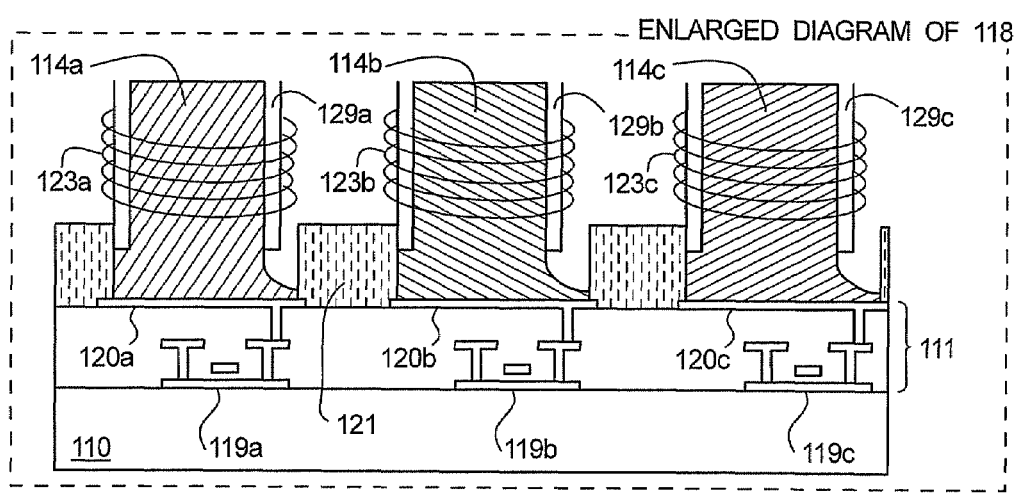

A process of forming a film from an organic EL material, which functions as an EL layer using a thin film formation apparatus of FIG. 13 is performed. A red color use nozzle 125a, a green color use nozzle 125b, and a blue color use nozzle 125c are attached to a head portion 124. A tube shape part is attached to the tip of the nozzles, and this is referred to as a contact element throughout this specification. Note that the contact elements attached to the red color use nozzle 125a, the green color use nozzle 125b, and the blue color use nozzle 125c are referred to as a contact element 129a, a contact element 129b, and a contact element 129c, respectively.

The contact elements are made from a semiconductor material, such as silicon or germanium, from a metal such as iron, copper, aluminum, stainless steel, from rubber, Teflon, glass, or plastic. An application liquid within the nozzles is injected in accordance with capillary action by contacting one end of the contact element with the bank. Note that the inside of the nozzles are filled with a red color EL layer application liquid 114a, a green color EL layer application liquid 114b, and a blue color EL layer application liquid 114c, respectively. The red color application liquid 114a, the green color application liquid 114b, and the blue color application liquid 114c can be applied simultaneously by the attached nozzles.

In addition, the ultrasonic oscillator 122 is attached to the head portion 124, and furthermore, the heaters 123a, 123b, and 123c are attached to the nozzles 125a, 125b, and 125c, respectively. The ultrasonic oscillator and the heaters are formed so as to make the application of the application liquid easier, as shown by the embodiment mode of this specification.

In Embodiment 3, the application position does not deviate once it is determined because the application liquid is applied along the bank 121.

Further, not only is the application liquid applied in accordance with moving the head portion 124 in a direction denoted by reference symbol "a", the application liquid spreads out over the application surface by capillary action and the can be applied uniformly and with good efficiency in Embodiment 3. The application liquid is applied to the pixel portion by repeating this operation, and then the solvent is vaporized by heat treatment, forming the organic EL material.

Note that, it is possible to use Embodiment 3 in the manufacture of the self-light-emitting device explained in Embodiment 1. The banks 121 may be formed in stripe shapes by patterning, and the operation of the head portion 124 may be controlled electrically. Note that it is also possible to form the banks 121 into a matrix shape and apply the application liquids to the pixel portion.

Figure 14A:
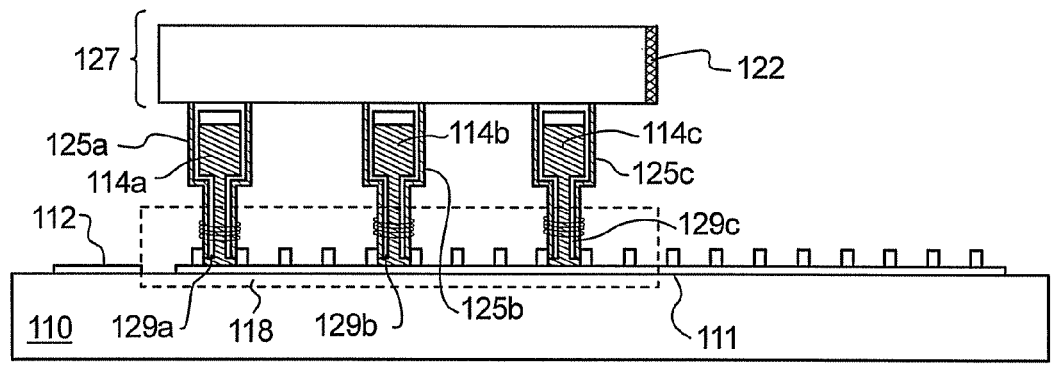
FIGS. 14A to 14C are diagrams showing an organic EL material application process of the present invention.
Figure 14B:
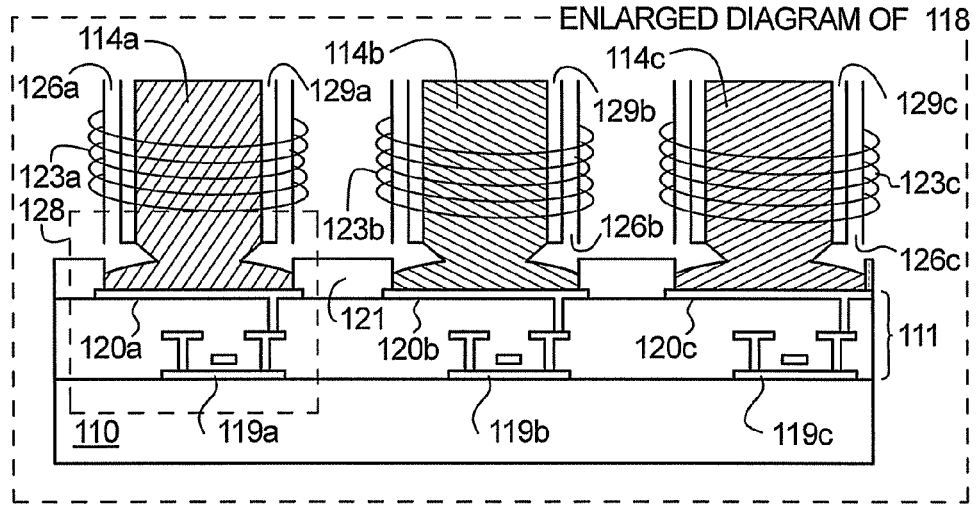
Figure 14C:
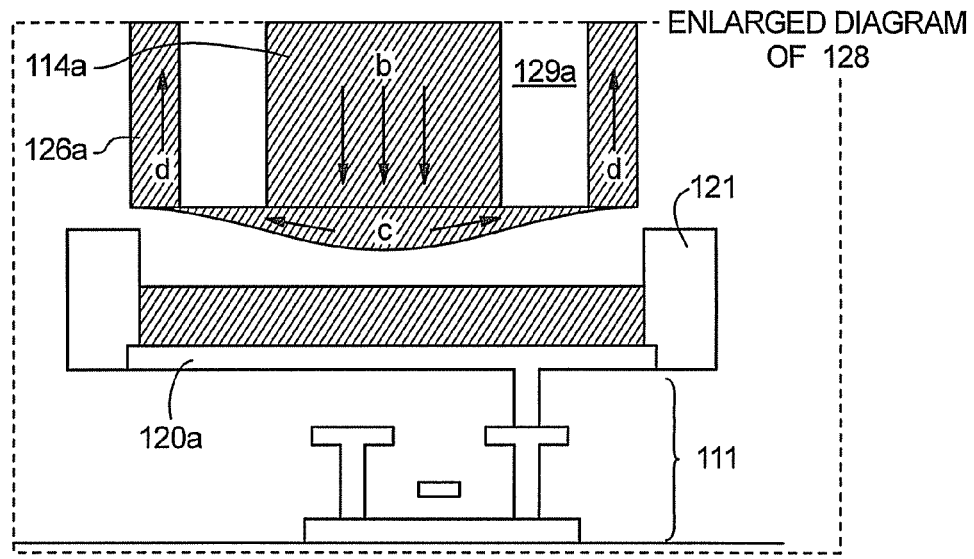

Relating to the fountain pen type application example, an example of improving the application method shown in Embodiment 3 by changing the structure of the nozzle portion is shown in FIGS. 14A to 14C.

The nozzles 125a, 125b, and 125c are each attached to a head portion 127, and each of the nozzles are made from one tube and flexible, small contact elements, similar to those shown in FIG. 13. However, the contact elements are positioned in locations not contacting the banks. Note that liquid intake tubes 126a, 126b, and 126c are attached to the nozzles shown in FIG. 14, respectively. Namely, the liquid intake tubes 126a, 126b, and 126c are attached to the outside of each of the contact elements, respectively, so as to become dual.

The role of the liquid intake tubes is explained using FIG. 14C. Note that FIG. 14C is an enlarged diagram of reference numeral 128 of FIG. 14B.

The application liquid 114a is discharged by capillary action when contacting a pixel electrode or when contacting already applied application liquid in an area of the pixel portion to which it must be applied.

In addition, discharge of the application liquid from the nozzle 125a is assisted by pressure applied in the direction of an arrow "b" and by the weight of the application liquid.

However, the application liquid spreads out in the direction shown by an arrow "c" due to surface tension at the instant it is discharged, and liquid cutoff becomes poor. Thus the liquid intake tube 126a is formed so as to absorb the spread out application liquid in the direction of the arrow "c".

Excess application liquid residing in the discharge portion can be removed by the absorption force which works by forming the liquid intake tube 126a, and the poor liquid cutoff is improved. Further, the size of the application liquid at the instant of discharge can be controlled, and in addition, this is effective in preventing liquid clogging of the discharge portion.

Further, the wettability may be increased in a tip portion of the outside of the nozzle tube so that the absorbed liquid is easily taken into the liquid intake tube.

Note that, in Embodiment 3, the application liquid taken in from each liquid intake tube is all recovered in the connected head portion 127. Note also that the application liquid recovered in the head portion may be taken in by a pump (not shown in the figures) to which it is connected on the outside of the head portion 127.

Embodiment 4

An example of an electrodeposition type application where application liquid is applied onto the pixel portion is shown in FIGS. 15A and 15B in Embodiment 4 in which an EL layer application liquid is made into charged particles which are controlled by application of a voltage when forming an EL layer. Note that FIG. 15A is a model diagram of Embodiment 4, and that FIG. 15B shows an example of implementing Embodiment 4. An application liquid is applied in a direction of an arrow "k" in both FIGS. 15A and 15B.

A bank 1802 is formed on a substrate 1801 as shown in FIG. 15A. An organic EL material is next dissolved in a solvent as an application liquid for an EL layer. Note that, in Embodiment 4, cyano-paraphenylene vinylene is used as a red color light emitting EL layer; polyphenylene vinylene is used as a green color light emitting EL layer; polyalkylphenylene is used as a blue color light EL layer, as organic materials, and toluene and N-methylpiloridon are used as the solvent.

Note also that alcohol or a boundary activation agent may be combined with the organic EL material of the solvent in order to increase solubility.

A mist shape of particles which is easily discharged form a nozzle is made next by applying ultrasonic oscillations or heat to the EL layer application liquid in a nozzle 1804. An electric voltage is applied to both the nozzle 1804 and to an extraction electrode 1805, and the mist shape particles are extracted from the nozzle 1804 by the extraction electrode 1805.

Note that the application liquid may be manufactured using a highly conductive solvent in order to make the extraction of the EL application liquid as charged particles easier.

In addition, the mist shape particles extracted by the extraction electrode 1805 are accelerated in the extraction direction (a direction from the nozzle 1804 toward the substrate 1801) by an acceleration electrode 1806. The flow of the charged particles is controlled by a control electrode 1807, and the charged particles are finally electrodeposited in a pixel portion on the substrate 1801.

After extracting the charged particles from the nozzle 1804 by the extraction electrode 1805 in embodiment 4, the charged particles are corrected by the acceleration electrode 1806 and the control electrode 1807 so as to electrodeposit in pixels on the substrate, but it is not always necessary to have three electrodes, but at least one or more.

Further, a heater 1808 and an ultrasonic oscillator 1809 are formed in the nozzle 1804. Note that the organic EL material is more easily extracted from the nozzle 1804 by applying heat from the heater 1808 and by adding ultrasonic oscillations from the ultrasonic oscillator.

Embodiment 5

A pixel column may be formed in a vertical direction with respect to looking at an active matrix type self-light-emitting device of the present invention in the direction of FIG. 10A, and the pixel column may be formed in a horizontal direction. In other words, the pixel column is arranged as in FIG. 16A when forming a vertical direction pixel column, and is arranged as in FIG. 16B when forming a horizontal direction pixel column.

Figure 16A:
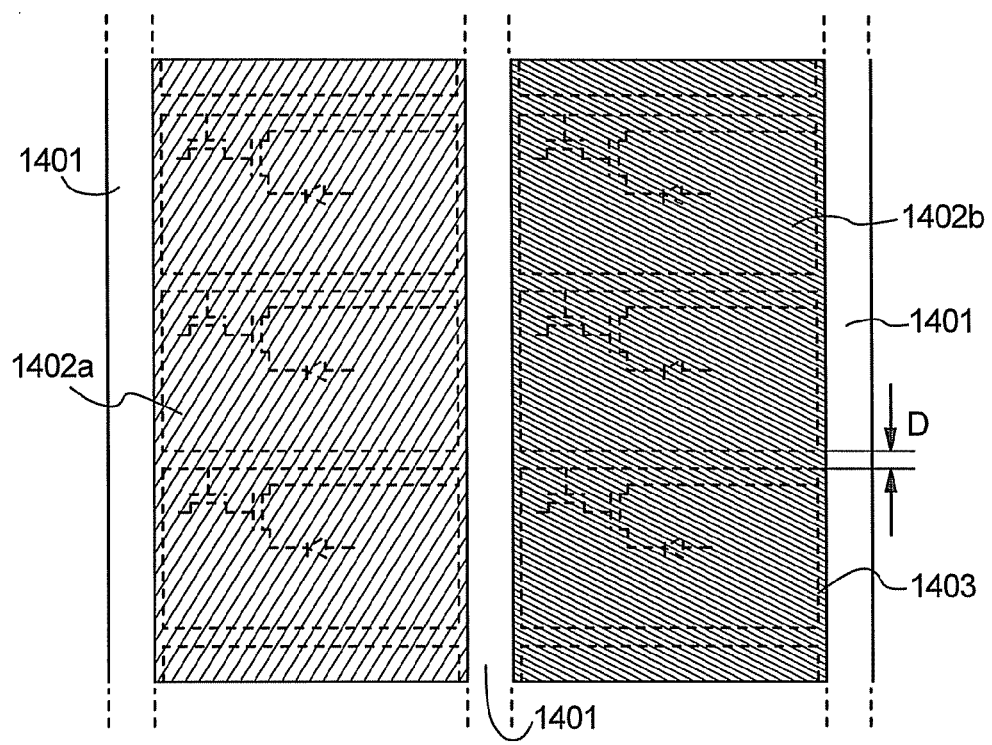
FIGS. 16A and 16B are enlarged diagrams of a pixel portion.

In FIG. 16A, reference numeral 1401 denotes banks formed in stripe shapes in a vertical direction, reference numeral 1402 denotes an EL layer which emits red color light, and reference numeral 1402$b$ denotes an EL layer which emits green color light. An EL layer which emits blue color light (not shown in the figures) may of course be formed adjacent to the green color light emitting EL layer 1402$b$. Note that the banks 1401 are formed on source wirings, through an insulating film, along the source wirings.

The term EL layer here indicates layers of organic EL materials such as an EL layer, an electric charge injecting layer, and an electric charge transporting layer, which contribute to light generation. A case of a single EL layer is possible, but a lamination film of a case of laminating a pole injecting layer and an EL layer, for example, is referred to as an EL layer.

A mutual distance D between pixels 1403 shown by a dotted line is preferably set equal to or greater than 5 times (more preferably equal to or greater than 10 times) a film thickness t of the EL layer. This is because problems of cross-talk can develop between pixels when D<5t. Note that a high definition image can not be obtained if the distance D is too great, and it is preferable that 5t<D<50t (more preferably 10t<D<35t).

Figure 16B:
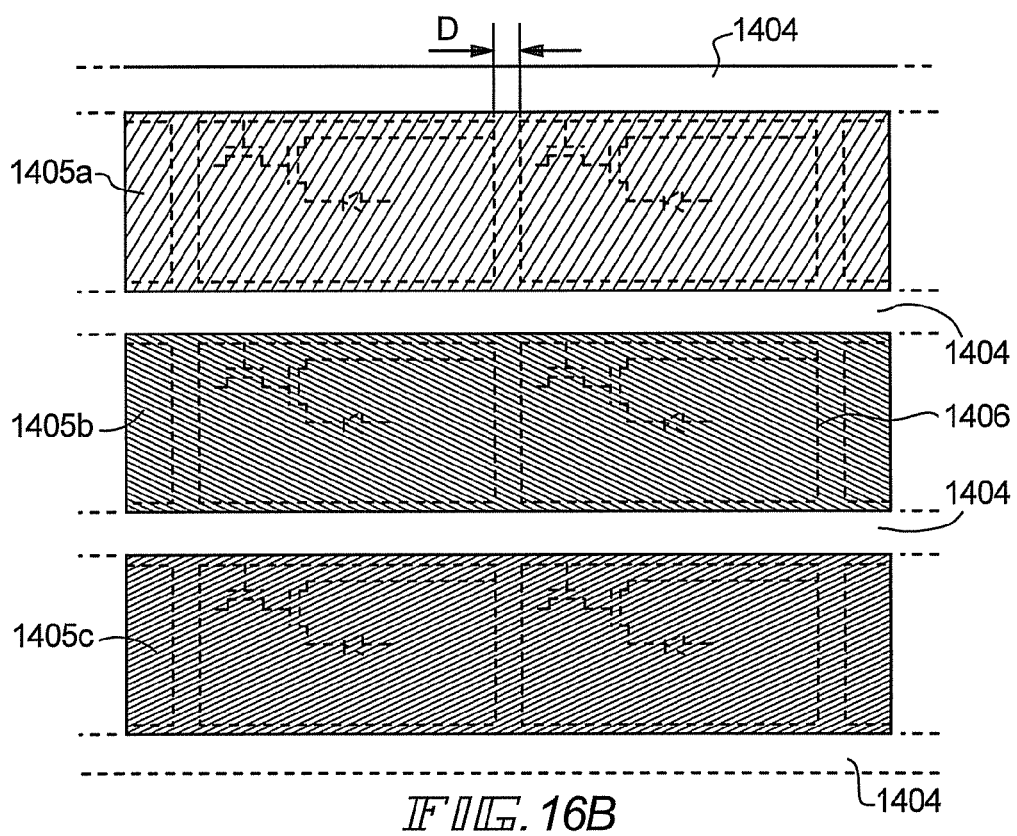

Further, in FIG. 16B, reference numeral 1404 denotes banks formed in stripe shapes in a horizontal direction, reference numeral 1405$a$ denotes an EL layer which emits red color light, and reference numeral 1405$c$ denotes an EL layer which emits green color light. Reference numeral 1405$c$ denotes an EL layer which emits green color light. Note that the banks 1404 are formed on gate wirings, through an insulating film, along the gate wirings.

In this case as well, the mutual distance D between pixels 1406 shown by a dotted line is also set equal to or greater than 5 times (preferably equal to or greater than 10 times) the film thickness of the EL layer, and in addition, is preferably set such that 5t<D<50t (more preferably such that 10t<D<35t).

The constitution of Embodiment 5 may be implemented in combination with the constitutions of any of Embodiment 1 to 3. It becomes possible to control the application position by electrically controlling the application liquid which forms the EL layers as in Embodiment 5.

Note that it is possible to implement the constitution of Embodiment 5 by freely combining it with the constitution of any of Embodiments 1 to 4.

Embodiment 6

Figure 17:
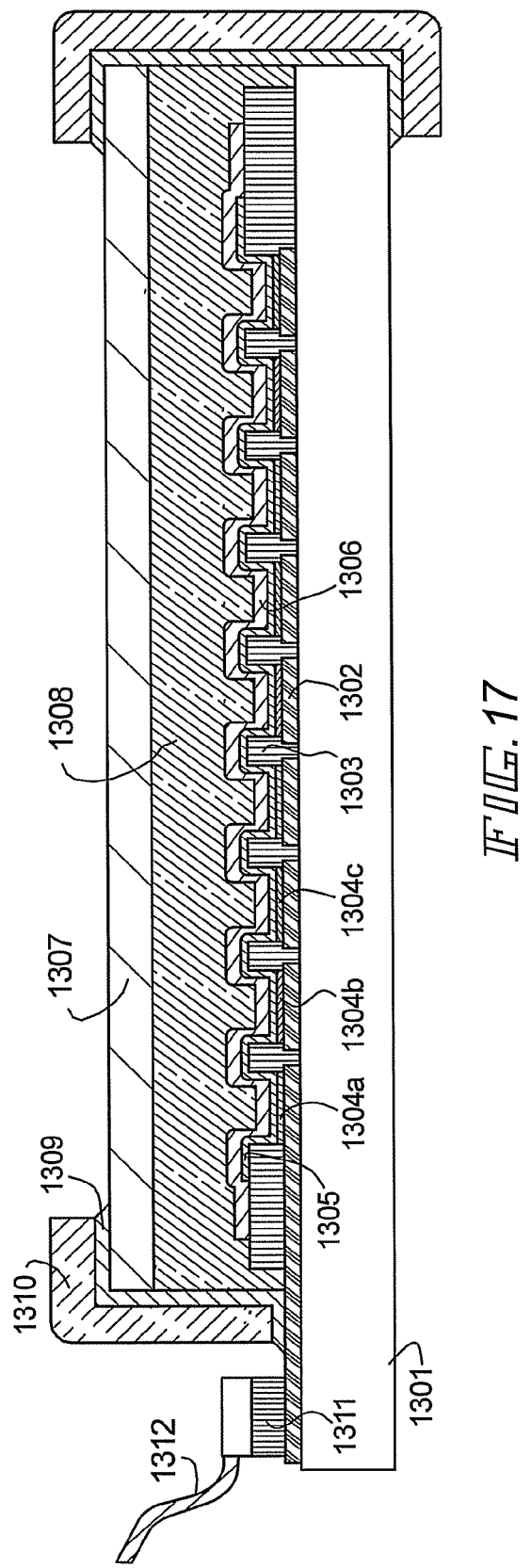
FIG. 17 is a diagram showing a cross sectional diagram of a passive type self-light-emitting device.

A case of using the present invention in a passive type (simple matrix type) self-light-emitting device is explained in Embodiment 6. FIG. 17 is used in the explanation. In FIG. 17, reference numeral 1301 denotes a substrate made from plastic, and reference numeral 1306 denotes anodes made from a transparent conducting film. A chemical compound of indium oxide and zinc oxide is formed by an evaporation method as the transparent conducting film in Embodiment 6. Note that, although not shown in FIG. 17, a plurality of anodes are arranged in a stripe shape in a direction which is perpendicular to the plane of the page.

Further, banks 1303 are formed so as to fill the space between the anodes 1302 arranged in the stripe shape. The banks 1303 are formed along the anodes 1302, in a direction perpendicular to the plane of the page.

EL layers 1304$a$ to 1304$c$ are formed next from a polymer organic EL material in accordance with a film formation method using the thin film formation device of FIG. 1. Of course, reference numeral 1304a denotes a red color light emitting EL layer, reference numeral 1304b denotes a green color light emitting EL layer, and reference numeral 1304c denotes a blue color light emitting EL layer. The organic EL material used may be similar to that used in Embodiment 1. The EL layers are formed along grooves formed by the banks 1302, and therefore are arranged in a stripe shape in a direction perpendicular to the plane of the page.

Next, although not shown by FIG. 17, a plurality of cathodes and a plurality of protecting electrodes have longitudinal directions in parallel directions, and are arranged in a stripe shape orthogonal to the anodes 1302. Note that the cathodes 1305 are MgAg, and that the protecting electrodes 1306 are aluminum alloy films in Embodiment 6, and both are formed by the evaporation method. Further, although not shown in the figure, a wiring is extended to a portion in which an FPC is later attached so as to apply a predetermined voltage to the protecting electrodes 1306 not shown.

Further, after forming the protecting electrodes 1306, not shown in the figure, a silicon nitride film may be formed here as a passivation film.

An EL element is thus formed on the substrate 1301. Note that the lower side electrodes are transparent anodes in Embodiment 6, and therefore light emitted by the EL layers 1304a to 1304c is emitted to the base (the substrate 1301). However, the EL element structure can be inverted and the lower electrodes can be made into light shielding cathodes. In that case, light emitted by the EL layers 1304a to 1304c is irradiated to an upper surface (the side opposite the substrate 1301).

Next, a ceramic substrate is prepared as a housing material 1307. A ceramic substrate is used because the housing may be light shielding with the structure of Embodiment 6, but of course a substrate made from plastic or glass may also be used for a case of inverted EL element structure, like that stated above, in which preferably the housing material should be transparent.

After thus preparing the housing material 1307, the housing material 1307 is joined by a filler material 1308 which has barium oxide added as a drying agent (not shown in the figure). A frame material 1310 is then attached using a sealing material 1309 made from an ultraviolet hardening resin. Stainless steel is used as the frame material 1310 in Embodiment 6. Lastly, an FPC 1312 is attached through an anisotropic conducting film 1311, and the passive type self-light-emitting device is completed.

Note that it is possible to implement the constitution of Embodiment 6 by freely combining it with the constitution of any of Embodiments 1 to 5.

Embodiment 7

When manufacturing an active matrix type self-light-emitting device by implementing the present invention, it is effective to use a silicon substrate (silicon wafer) as a substrate. When using a silicon substrate as the substrate, switching elements and electric current control elements formed in a pixel portion, and driver elements formed in a driver circuit portion can be manufactured using a MOSFET manufacturing technique used in conventional ICs and LSIs.

It is possible to form circuits having extremely little dispersion, such as that achieved for ICs and LSIs, by using MOSFET, and in particular this is effective for an analog drive active matrix type self-light-emitting device which performs grey-scale display by electric current values.

Note that silicon substrates are light shading, and therefore it is necessary to use a structure in which light from the EL layers is irradiated to the side opposite the substrate. The self-light-emitting device of Embodiment 7 is structurally similar to that of FIGS. 10A and 10B, and the difference is in that MOSFETs are used as substitutes for the TFTs forming the pixel portion 602 and the driver circuit portion 603.

Note that it is possible to implement the constitution of Embodiment 7 by freely combining it with the constitution of any of Embodiments 1 to 6.

Embodiment 8

The self-emission device fabricated in accordance with the present invention is of the self-emission type, and thus exhibits more excellent recognizability of the displayed image in a light place as compared to the liquid crystal display device. Furthermore, the self-emission device has a wider viewing angle. Accordingly, the self-emission device can be applied to a display portion in various electronic devices. For example, in order to view a TV program or the like on a large-sized screen, the self-emission device in accordance with the present invention can be used as a display portion of an EL display (i.e., a display in which an self-emission device is installed into a frame) having a diagonal size of 30 inches or larger (typically 40 inches or larger.) The EL display includes all kinds of displays to be used for displaying information, such as a display for a personal computer, a display for receiving a TV broadcasting program, a display for advertisement display. Moreover, the self-emission device in accordance with the present invention can be used as a display portion of other various electric devices.

Such electronic devices include a video camera, a digital camera, a goggles-type display (head mount display), a car navigation system, a sound reproduction device (a car audio equipment and an audio equipment etc.), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a compact disc (CD), a laser disc (LD), a digital video disc (DVD), and includes a display for displaying the reproduced image), or the like. In particular, in the case of the portable information terminal, use of the EL display device is preferable, since the portable information terminal that is likely to be viewed from a tilted direction is often required to have a wide viewing angle. FIGS. 18A to 19F respectively show various specific examples of such electronic devices.

Figure 18A:
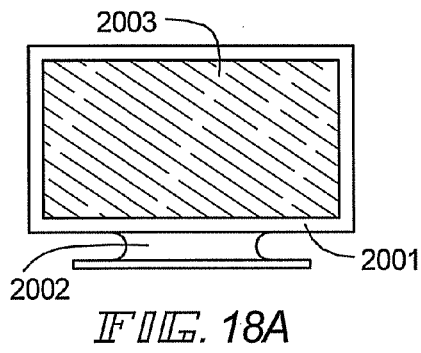
FIGS. 18A to 18F are diagrams showing specific examples of electronic equipment.

FIG. 18A illustrates an EL display which includes a frame 2001, a support table 2002, a display portion 2003, or the like. The present invention is applicable to the display portion 2003. The EL display is of the self-emission type and therefore requires no back light. Thus, the display portion thereof can have a thickness thinner than that of the liquid crystal display device.

Figure 18B:
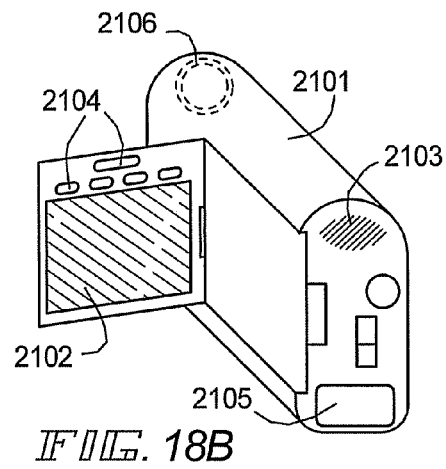

FIG. 18B illustrates a video camera which includes a main body 2101, a display portion 2102, an audio input portion 2103, operation switches 2104, a battery 2105, an image receiving portion 2106, or the like. The self-emission device in accordance with the present invention can be used as the display portion 2102.

Figure 18C:
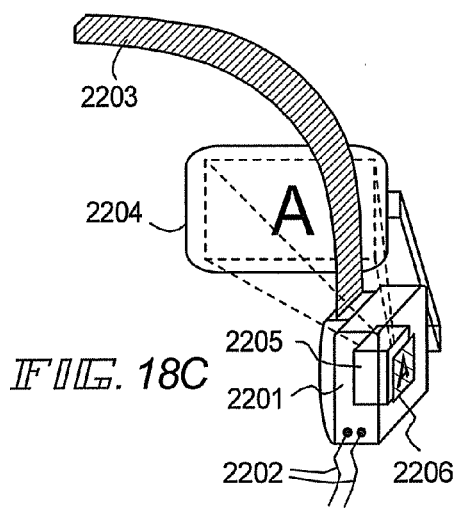

FIG. 18C illustrates a portion (the right-half piece) of an EL display of head mount type, which includes a main body 2201, signal cables 2202, a head mount band 2203, a display portion 2204, an optical system 2205, an self-emission device 2206, or the like. The present invention is applicable to the self-emission device 2206.

Figure 18D:
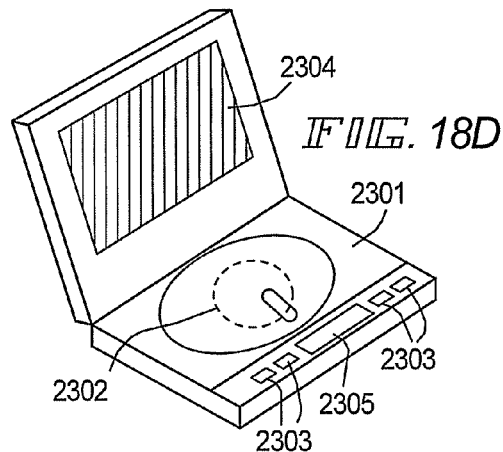

FIG. 18D illustrates an image reproduction apparatus including a recording medium (more specifically, a DVD reproduction apparatus), which includes a main body 2301, a recording medium (a DVD or the like) 2302, operation switches 2303, a display portion (a) 2304, another display portion (b) 2305, or the like. The display portion (a) is used mainly for displaying image information, while the display portion (b) is used mainly for displaying character information. The self-emission device in accordance with the present invention can be used as these display portions (a) and (b). The image reproduction apparatus including a recording medium further includes a game machine or the like.

Figure 18E:
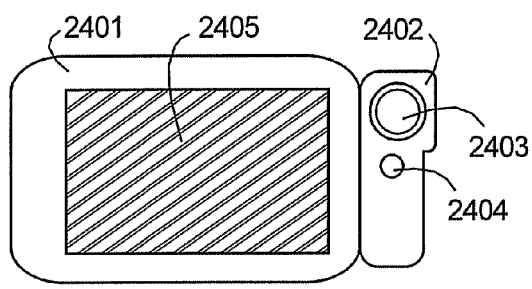

FIG. 18E illustrates a portable (mobile) computer which includes a main body 2401, a camera portion 2402, an image receiving portion 2403, operation switches 2404, a display portion 2405, or the like. The self-emission device in accordance with the present invention can be used as the display portion 2405.

Figure 18F:
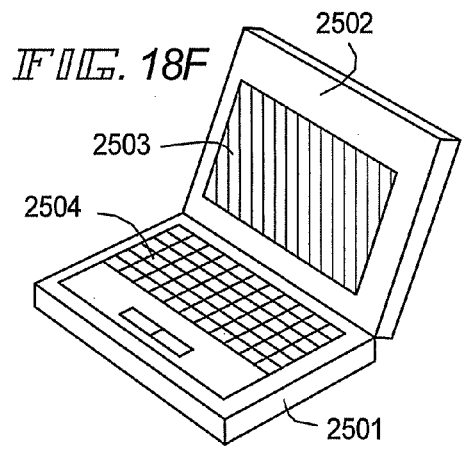

FIG. 18F illustrates a personal computer which includes a main body 2501, a frame 2502, a display portion 2503, a key board 2504, or the like. The self-emission device in accordance with the present invention can be used as the display portion 2503.

When the brighter luminance of light emitted from the EL material becomes available in the future, the EL display device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The self-emission device is suitable for displaying moving pictures since the EL material can exhibit high response speed. However, if the contour between the pixels becomes unclear, the moving pictures as a whole cannot be clearly displayed. Since the self-emission device in accordance with the present invention can make the contour between the pixels clear, it is significantly advantageous to apply the EL display device of the present invention to a display portion of the electronic devices.

A portion of the self-emission device that is emitting light consumes power, so it is desirable to display information in such a manner that the light emitting portion therein becomes as small as possible. Accordingly, when the EL display device is applied to a display portion which mainly displays character information, e.g., a display portion of a portable information terminal, and more particular, a portable telephone or a car audio equipment, it is desirable to drive the EL display device so that the character information is formed by a light-emitting portion while a non-emission portion corresponds to the background.

Figure 19A:
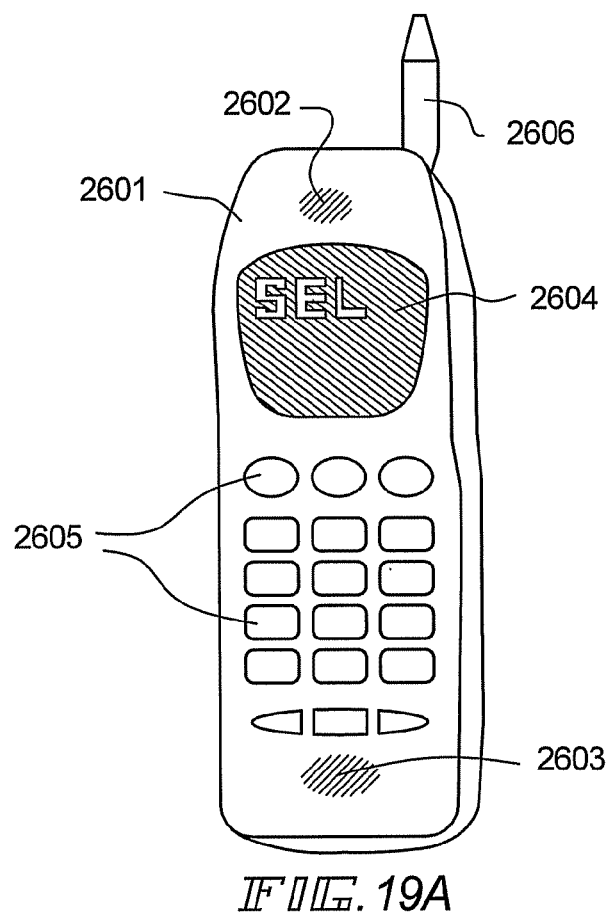
FIGS. 19A and 19B are diagrams showing specific example of electronic equipment.

With now reference to FIG. 19A, a portable telephone is illustrated, which includes a main body 2601, an audio output portion 2602, an audio input portion 2603, a display portion 2604, operation switches 2605, and an antenna 2606. The self-emission device in accordance with the present invention can be used as the display portion 2604. The display portion 2604 can reduce power consumption of the portable telephone by displaying white-colored characters on a black-colored background.

Figure 19B:
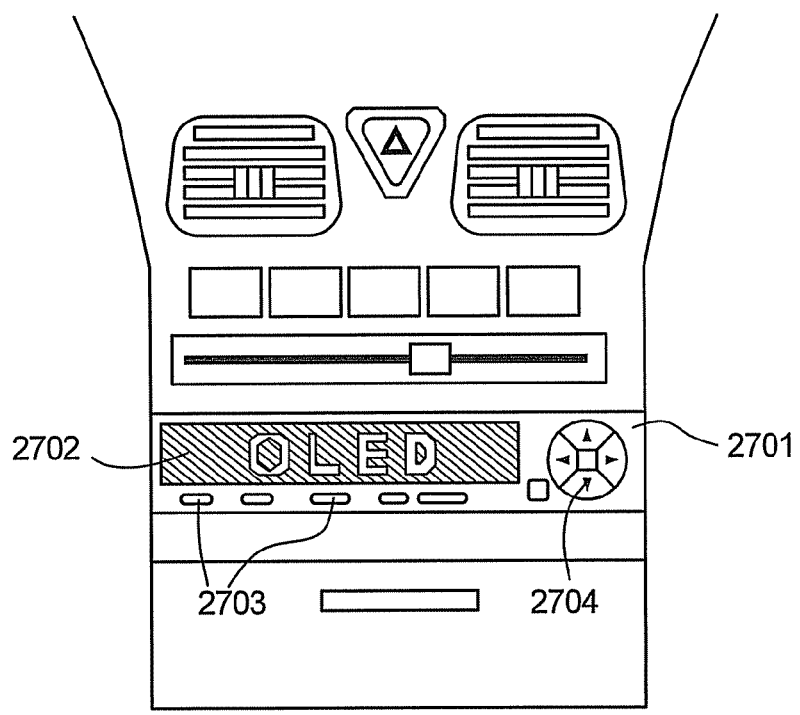

FIG. 19B illustrates a sound reproduction device, a car audio equipment in concrete term, which includes a main body 2701, a display portion 2702, and operation switches 2703 and 2704. The self-emission device in accordance with the present invention can be used as the display portion 2702. Although the car audio equipment of the mount type is shown in the present embodiment, the present invention is also applicable to an audio of the set type. The display portion 2702 can reduce power consumption by displaying white-colored characters on a black-colored background, which is particularly advantageous for the audio of o the portable type.

As set forth above, the present invention can be applied variously to a wide range of electronic devices in all fields. The electronic device in the present embodiment can be obtained by utilizing an self-emission device having the configuration in which the structures in Embodiments 1 through 7 are freely combined.

Embodiment 9

A structure in which an ultrasonic oscillator is formed in a head portion of a nozzle in the thin film formation apparatus within this specification is shown, and it is preferable to add ultrasonic oscillations in order to make the liquid cut-off in a tip portion of the nozzle better by forming the ultrasonic oscillator.

Note that a magnetostrictive material, in which elongation and contraction shape changes develop due to the application of a magnetic field (also referred to as magnetostrictive phenomenon), such as a composite of nickel, chromium, and cobalt or a composite of iron and aluminum; and a piezoelectric material, in which displacement and force develop upon application of a voltage, such as barium titanate ($BaTiO_3$) and titanium oxide zirconium oxide lead ($Pb(Zr, Ti)O_3$) are used as the ultrasonic oscillator material.

Figure 20A:
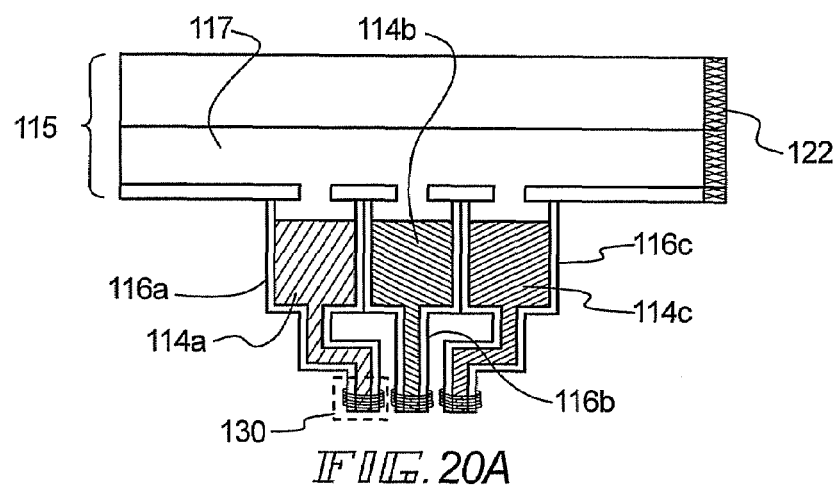
FIGS. 20A and 20B are diagrams showing structures of a thin film formation apparatus.
Figure 20B:
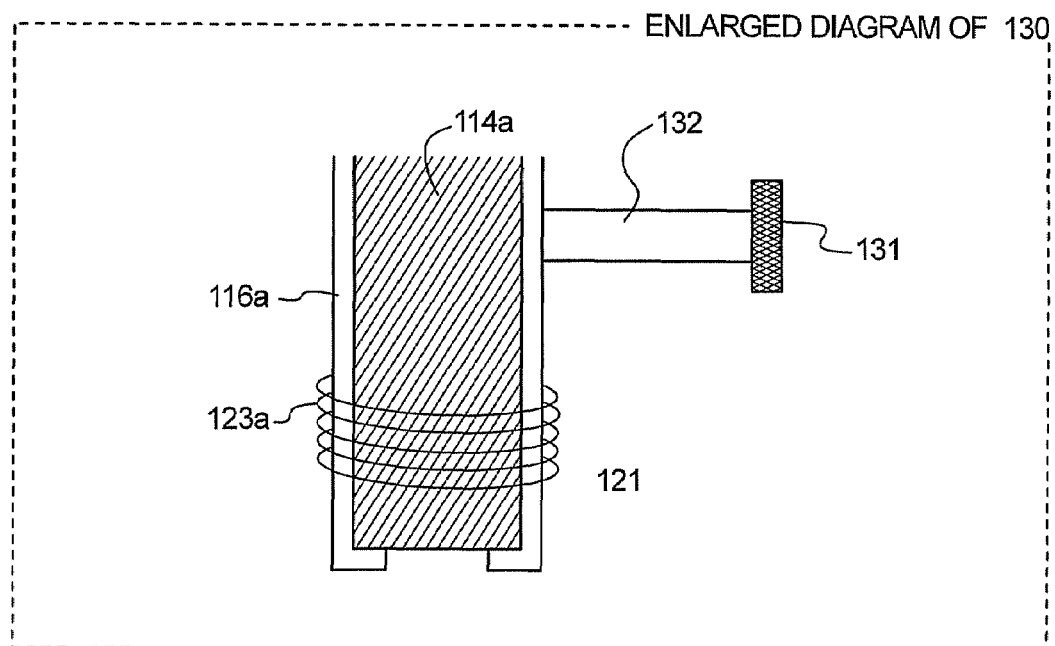

Further, as for its structure, the ultrasonic oscillator 122 is formed in the head portion of the thin film formation apparatus, as shown by FIG. 20A, and may be set so that ultrasonic oscillations imparted by the ultrasonic oscillator 122 are most transmitted to the tip of the nozzle, namely the peak of the oscillation amplitude may be set there. A structure in which direct oscillation plate 132 is contacted with the nozzle, as shown in FIG. 20B, and ultrasonic oscillations are effectively transmitted to the tip of the nozzle from an ultrasonic oscillator 131 connected to the oscillation plate 132 may also be used.

Note that it is possible to implement the constitution of Embodiment 9 by freely combining it with the constitution of any of Embodiments 1 to 8.

Improvements with respect to poor liquid cut-off and liquid clogging when film formation of an organic EL material is performed can be achieved by implementing the present invention. Further, various methods of forming a film of an organic EL material are shown in the present invention, and therefore it is possible to perform film formation corresponding to various conditions and uses, and the manufacturing throughput of self-light-emitting devices using a polymer organic EL material can be increased.

What is claimed is:
1. A method of manufacturing a light-emitting device, comprising:
   discharging a liquid comprising an organic light-emitting material to a pixel column over a substrate through a contact element from a nozzle by contacting the contact element to a bank so that the contact element and the pixel column are connected through the liquid comprising said organic light-emitting material, wherein the contact element is provided at a tip of the nozzle.

2. A method of manufacturing a light-emitting device according to claim 1, wherein said nozzle has a large internal diameter portion and a small internal diameter portion.

3. A method of manufacturing a light-emitting device according to claim 1, further comprising forming a pixel electrode over the substrate.

4. A method of manufacturing a light-emitting device according to claim 3, wherein the bank covers an edge portion of the pixel electrode.

5. A method of manufacturing a light-emitting device according to claim 1, further comprising:

forming a thin film transistor over the substrate;

forming an insulating film over said thin film transistor.

6. A method of manufacturing a light-emitting device according to claim 1, wherein said liquid comprising said organic light-emitting material is discharged with scanning the nozzle along a direction parallel to the pixel column.

7. A method of manufacturing a light-emitting device according to claim 1, wherein ultrasonic oscillation is applied to the liquid complising the organic light-emitting material when the liquid is discharged from the nozzle.

8. A method of manufacturing a light-emitting device according to claim 1, wherein the liquid comprising the organic light-emitting material is heated when the liquid is discharged from the nozzle.

9. A method of manufacturing a light-emitting device according to claim 1, wherein the bank comprises a resin material.

10. A method of manufacturing a light-emitting device according to claim 1, wherein the light-emitting device is a passive type.

11. A method of manufacturing a light-emitting device, comprising:

discharging a liquid comprising a light-emitting material to a pixel column over a substrate through a contact element from a nozzle by contacting the contact element to a bank so that the contact element and the pixel column are connected through the liquid comprising said light-emitting material, wherein the contact element is provided at a tip of the nozzle.

12. A method of manufacturing a light-emitting device according to claim 11, wherein said nozzle has a large internal diameter portion and a small internal diameter portion.

13. A method of manufacturing a light-emitting device according to claim 11, further comprising forming a pixel electrode over the substrate.

14. A method of manufacturing a light-emitting device according to claim 13 wherein the bank covers an edge portion of the pixel electrode.

15. A method of manufacturing a light-emitting device according to claim 11, further comprising:

forming a thin film transistor over the substrate;

forming an insulating film over said thin film transistor.

16. A method of manufacturing a light-emitting device according to claim 11, wherein said liquid comprising said light-emitting material is discharged with scanning the nozzle along a direction parallel to the pixel column.

17. A method of manufacturing a light-emitting device according to claim 11, wherein ultrasonic oscillation is applied to the liquid comprising the light-emitting material when the liquid is discharged from the nozzle.

18. A method of manufacturing a light-emitting device according to claim 11, wherein the liquid comprising the light-emitting material is heated when the liquid is discharged from the nozzle.

19. A method of manufacturing a light-emitting device according to claim 11, wherein the bank comprises a resin material.

20. A method of manufacturing a light-emitting device according to claim 11, wherein the light-emitting device is a passive type.

21. A method of manufacturing an active matrix type-light-emitting device, comprising:

forming a pixel column comprising a plurality of pixel electrodes and a plurality of thin film transistors, discharging a liquid comprising an organic light-emitting material to the pixel column over a substrate through a contact element from a nozzle by contacting the contact element to a bank so that the contact element and the pixel column are connected through the liquid comprising said organic light-emitting material, wherein the contact element is provided at a tip of the nozzle.

22. A method of manufacturing an active matrix light-emitting device according to claim 21, wherein said nozzle has a large internal diameter portion and a small internal diameter portion.

23. A method of manufacturing an active matrix light-emitting device according to claim 21, wherein said liquid comprising said organic light-emitting material is discharged with scanning the nozzle along a direction parallel to the pixel column.

24. A method of manufacturing an active matrix light-emitting device according to claim 21, wherein ultrasonic oscillation is applied to the liquid comprising the organic light-emitting material when the liquid is discharged from the nozzle.

25. A method of manufacturing an active matrix light-emitting device according to claim 21, wherein the liquid comprising the organic light-emitting material is heated when the liquid is discharged from the nozzle.

26. A method of manufacturing an active matrix light-emitting device according to claim 21, wherein the bank comprises a resin material.

27. A method of manufacturing an active matrix light-emitting device according to claim 21, wherein the bank covers an edge portion of the plurality of pixel electrodes.

28. A method of manufacturing an active matrix light-emitting device, comprising:

forming a pixel column comprising a plurality of pixel electrodes and a plurality of thin film transistors, discharging a liquid comprising a light-emitting material to the column over a substrate through a contact element from a nozzle by contacting the contact element to a bank so that the contact element and the pixel column are connected through the liquid comprising said light-emitting material, wherein the contact element is provided at a tip of the nozzle.

29. A method of manufacturing an active matrix light-emitting device according to claim 28, wherein said nozzle has a large internal diameter portion and a small internal diameter portion.

30. A method of manufacturing an active matrix light-emitting device according to claim 28,
    wherein said liquid comprising said light-emitting material is discharged with scanning the nozzle along a direction parallel to the pixel column.

31. A method of manufacturing an active matrix light-emitting device according to claim 28, wherein ultrasonic oscillation is applied to the liquid comprising the light-emitting material when the liquid is discharged from the nozzle.

32. A method of manufacturing an active matrix light-emitting device according to claim 28, wherein the liquid comprising the light-emitting material is heated when the liquid is discharged from the nozzle.

33. A method of manufacturing an active matrix light-emitting device according to claim 28, wherein the bank comprises a resin material.

34. A method of manufacturing an active matrix emitting device according to claim 28, wherein the bank covers an edge portion of the plurality of pixel electrodes.

* * * * *